United States Patent
Maharyta et al.

(10) Patent No.: US 10,545,614 B2
(45) Date of Patent: Jan. 28, 2020

(54) TWO-ELECTRODE TOUCH BUTTON WITH A MULTI-PHASE CAPACITANCE MEASUREMENT PROCESS

(71) Applicant: Cypress Semiconductor Corporation, San Jose, CA (US)

(72) Inventors: Andriy Maharyta, Lviv (UA); Pavlo Saldak, San Jose, CA (US); Vadym Grygorenko, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/006,577

(22) Filed: Jun. 12, 2018

(65) Prior Publication Data

US 2019/0227669 A1     Jul. 25, 2019

Related U.S. Application Data

(60) Provisional application No. 62/620,067, filed on Jan. 22, 2018.

(51) Int. Cl.
  *G06F 3/041*     (2006.01)
  *G06F 3/044*     (2006.01)
  *H03K 17/96*     (2006.01)

(52) U.S. Cl.
  CPC ............ *G06F 3/0418* (2013.01); *G06F 3/044* (2013.01); *H03K 17/962* (2013.01); *H03K 2217/960705* (2013.01); *H03K 2217/960745* (2013.01); *H03K 2217/960765* (2013.01)

(58) Field of Classification Search
  CPC ..... G06F 3/0418; G06F 3/044; H03K 17/962; H03K 2217/960705; H03K 2217/960745; H03K 2217/960765

USPC .......................................................... 345/174
See application file for complete search history.

(56) References Cited

U.S. PATENT DOCUMENTS

| | | | |
|---|---|---|---|
| 8,717,331 B2 | 5/2014 | Kremin et al. | |
| 8,902,191 B2 | 12/2014 | Hoch | |
| 8,937,607 B2 | 1/2015 | Brown et al. | |
| 9,166,621 B2 | 10/2015 | Kremin | |
| 9,176,636 B1 * | 11/2015 | Maharyta | H03K 17/22 |
| 9,377,905 B1 | 6/2016 | Grivna et al. | |
| 9,542,051 B2 | 1/2017 | Davison et al. | |
| 9,628,104 B2 | 4/2017 | Wang et al. | |
| 9,684,418 B1 | 6/2017 | Hills et al. | |

(Continued)

FOREIGN PATENT DOCUMENTS

EP       3213173 A1     9/2017

OTHER PUBLICATIONS

International Search Report for International Application No. PCT/US19/13945 dated Apr. 10, 2019; 2 pages.

(Continued)

*Primary Examiner* — Jennifer Mehmood
*Assistant Examiner* — Ngan T Pham Lu

(57) ABSTRACT

A method, apparatus, and system to detect whether a two-electrode touch button is pressed using a first self-capacitance measurement of an inner electrode of the two-electrode touch button and a second self-capacitance measurement of an outer electrode of the two-electrode touch button. The method, apparatus, and system further to detect whether the two-electrode touch button is pressed in view of presence of water proximate to the touch button.

20 Claims, 13 Drawing Sheets

(56) References Cited

U.S. PATENT DOCUMENTS

| | | | |
|---|---|---|---|
| 9,804,213 B2 | 10/2017 | Reynolds et al. | |
| 2010/0097346 A1* | 4/2010 | Sleeman | G06F 3/0412 |
| | | | 345/174 |
| 2014/0292396 A1* | 10/2014 | Bruwer | H03K 17/955 |
| | | | 327/517 |
| 2016/0004361 A1* | 1/2016 | Maharyta | G06F 3/044 |
| | | | 345/174 |
| 2016/0154507 A1* | 6/2016 | Bharathan | G06F 3/011 |
| | | | 345/174 |
| 2017/0254633 A1 | 9/2017 | Tanahashi et al. | |
| 2017/0255297 A1 | 9/2017 | Narayanasamy et al. | |
| 2018/0003752 A1 | 1/2018 | Bharathan | |

OTHER PUBLICATIONS

Written Opinion of the International Searching Authority for International Application No. PCT/US19/13945 dated Apr. 10, 2019; 5 pages.

"In-Depth Understanding of Water Tolerance Feature in Touch-Sensing Software LibraryEduardo Viramontes," Eduardo Viramontes et al., Sep. 2013; 13 pages.

Atmel AVR3002: Moisture Tolerant QTouch Design; 14 pages.

* cited by examiner

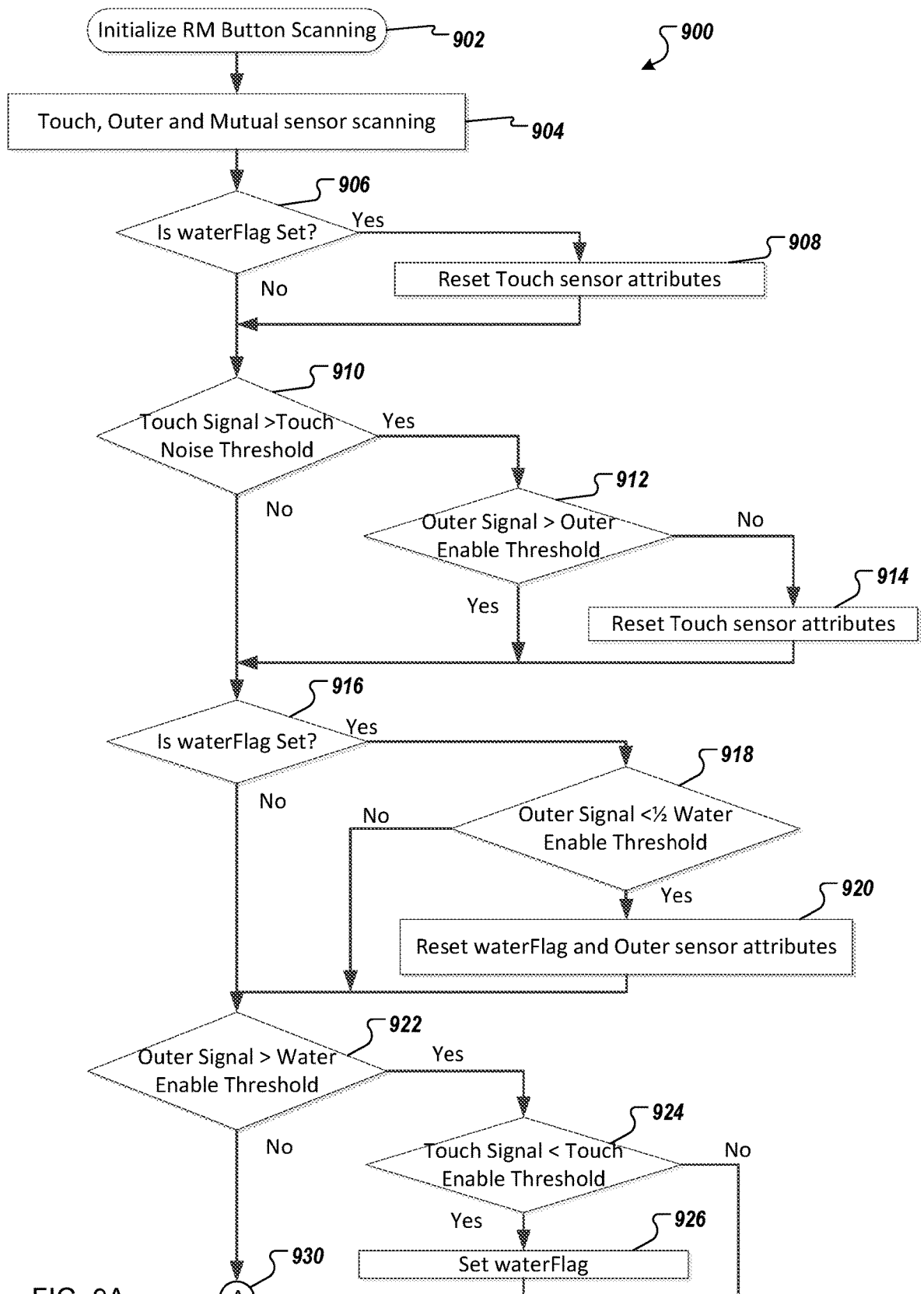
FIG. 9A (cont. at FIG. 9B)    (cont. at FIG. 9B)

TWO-ELECTRODE TOUCH BUTTON WITH A MULTI-PHASE CAPACITANCE MEASUREMENT PROCESS

RELATED APPLICATIONS

This application claims the benefit of U.S. Provisional Application No. 62/620,067, filed Jan. 22, 2018, which is hereby incorporated herein by reference in its entirety.

TECHNICAL FIELD

The present disclosure relates generally to sensing systems, and more particularly to capacitance measurement systems configurable to determine whether a touch button is pressed, even in wet conditions.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs, and other similar mechanical user interface controls. The use of a capacitive sense element allows for the elimination of complicated mechanical switches and buttons, providing reliable operation under harsh conditions. In addition, capacitive sense elements are widely used in modern customer applications, providing user interface options in existing products. Capacitive sense elements can range from a single button to a large number arranged in the form of a capacitive sense array for a touch-sensing surface.

Capacitive sense arrays and touch buttons are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element and evaluating for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes can be measured by an electrical circuit. The electrical circuit converts the signals corresponding to measured capacitances of the capacitive sense elements into digital values. The measured capacitances are generally received as currents or voltages that are integrated and converted to the digital values.

There are two typical types of capacitance: 1) mutual capacitance where the capacitance-sensing circuit measures a capacitance formed between two electrodes coupled to the capacitance-sensing circuit; 2) self-capacitance where the capacitance-sensing circuit measure a capacitance of one electrode. A touch panel has a distributed load of capacitance of both types (1) and (2) and some touch solutions sense both capacitances either uniquely or in hybrid form with its various sense modes.

BRIEF DESCRIPTION OF THE DRAWINGS

The present embodiments are illustrated by way of example, and not of limitation, in the figures of the accompanying drawings.

FIGS. 9A-9B are flow diagrams of a multi-stage capacitance measurement method according to one embodiment.

DETAILED DESCRIPTION

Figure 1:
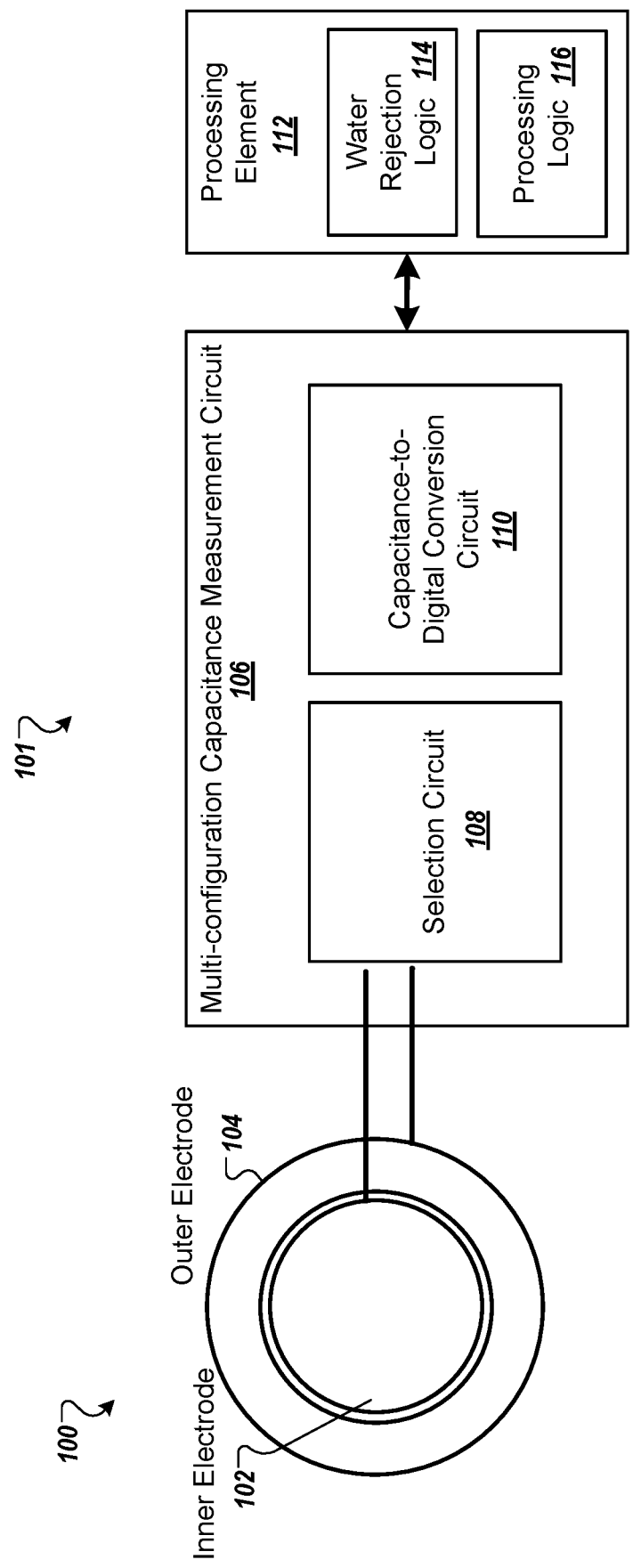
FIG. 1 is a block diagram illustrating an electronic system with a two-electrode touch button and a processing device to determine whether the touch button is pressed even in a wet environment according to one embodiment.

In the following description, for purposes of explanation, numerous specific details are set forth in order to provide a thorough understanding of the present embodiments. It will be evident, however, to one skilled in the art that the present embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment. The phrase "in one embodiment" located in various places in this description does not necessarily refer to the same embodiment.

In capacitive touch sensing systems, water may be present on a touch button, resulting in corrupt measurement, false touches, and lost touches. For example, the measured capacitance values of water on capacitive buttons are similar to the measured capacitance value of a touch on capacitive buttons. As a result, water on a capacitive button may be mistaken as an actual touch and a resultant false touch reported. The embodiments described herein are directed at detecting the presence of water on a sense array, specifically on a two-electrode touch button, and detecting a touch on the two-electrode touch button even in the presence of water. The embodiments herein may accurately measure a touch under a variety of water conditions, such as described below with respect to the figures. The proposed constructions of the touch button and scanning procedures can also provide an advantage of only using two electrodes, yet still achieve waterproofing. Also, the electrodes' size can be similar to a regular single-electrode touch sensor and can be applied in low-size applications. For example, automotive and outdoor applications need to reject large grounded water droplets. The embodiments described herein may provide a design for capacitance measuring that eliminates or reduces the problem introduced by large grounded water droplets. In one embodiment, a ratiometric capacitance sensor construction can be used with a measuring method that is insensitive to large grounded water droplets. Alternatively, other advantages may be achieved.

Described herein are devices, methods, and systems that determine whether a touch button, including an inner electrode substantially surrounded by an outer electrode, is pressed using a two-stage measurement process. The two stages may also be considered two phases. In a first stage, a self-capacitance measurement of the inner electrode is measured while an active shield signal is coupled to the outer electrode. In a second stage, a self-capacitance measurement of the outer electrode is measured while the inner electrode is coupled to a fixed voltage. The self-capacitance measurements of the two electrodes are used to determine whether the touch button is pressed. In some embodiments, a ratiometric self-capacitance measurement circuit is used. In other embodiments, a multi-stage self-capacitance measurement circuit is used.

FIG. 1 is a block diagram illustrating an electronic system with a two-electrode touch button 100 and a processing device 101 to determine whether the touch button 100 is pressed even in a wet environment according to one embodiment. The electrode touch button 100 includes an inner electrode 102 substantially surrounded by an outer electrode 104. The processing device 101 includes a multi-stage measurement circuit 106 and a processing element 112. The multi-configuration capacitance measurement circuit 106 includes a selection circuit 108 and a capacitance-to-digital conversion circuit 110. The capacitance measurement circuit 106 is coupled to the touch button 100. The processing element 112 is coupled to the multi-configuration capacitance measurement circuit 106. The multi-configuration capacitance measurement circuit 106 is to measure self-capacitance of the inner electrode 102 and the outer electrode 104, in multiple stages. In one embodiment, the processing element 112 determines whether the touch button 100 is pressed using a two-stage measurement process as described below. The processing element 112 can include water rejection logic 114 to perform the two-stage measurement process to determine whether the touch button 100 is pressed using the selection circuit 108 and the capacitance-to-digital conversion circuit 110. Alternatively, processing logic 116 can be used to implement the two-stage measurement process.

Figure 4:
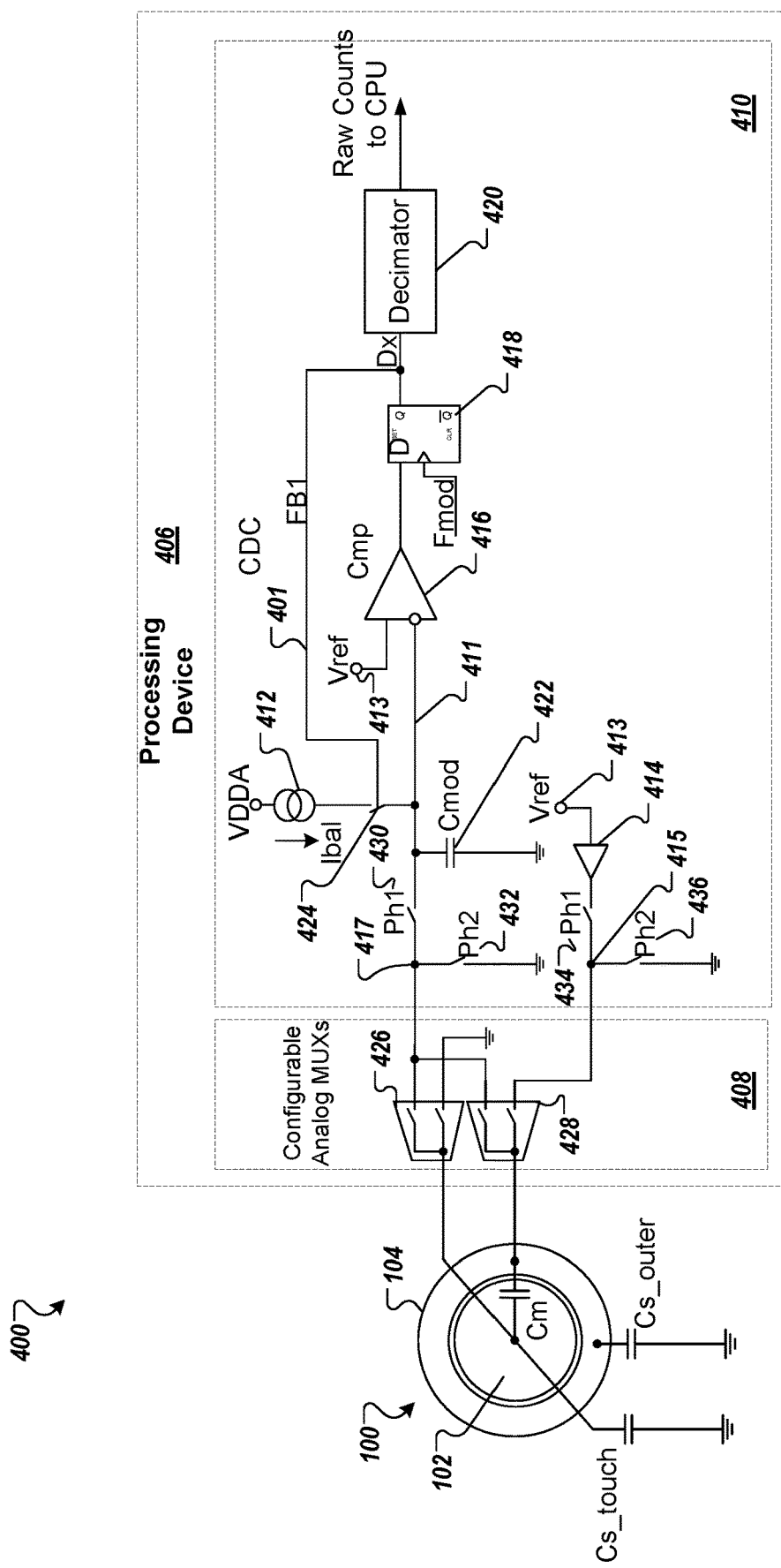
FIG. 4 is a block diagram an electronic system that measures capacitances of a touch button according to one embodiment.

In a first stage of the multi-stage measurement process, a first self-capacitance measurement of the inner electrode 102 is made by the multi-configuration capacitance measurement circuit 106 while an active shield signal is coupled to the outer electrode 104. In a second stage of the multi-stage measurement process, a second self-capacitance measurement of the outer electrode 104 is made while a fixed voltage is coupled to the inner electrode 102. In a further embodiment, the water rejection logic 114 uses the first self-capacitance measurement and the second self-capacitance measurement to determine whether the touch button 100 is pressed. The water rejection logic 114 may use the methodologies described herein, such as the method 700 in FIG. 7 or the methods described in FIGS. 8, 9A, and 9B. Alternatively, the water rejection logic 114 can perform other operations to determine whether the touch button 100 has been pressed. In one embodiment, the multi-configuration capacitance measurement circuit 106 includes a ratiometric capacitance measurement circuit for the capacitance-to-digital conversion circuit 110. In another embodiment, the multi-configuration capacitance measurement circuit 106 includes a multi-stage self-capacitance measurement circuit, such as illustrated in FIG. 4.

In one embodiment, the inner electrode 102 has a first surface area and the outer electrode 104 has a second surface area. The first surface area and the second surface area may be substantially similar. The form factor of the touch button 100 may be similar to a single-electrode touch button, yet provide water proofing as described herein.

In one embodiment, the capacitance-to-digital conversion circuit 110 includes a programmable current source, a driver, a comparator, a flip-flop, a decimator, and a modulator. These components can be organized and configured to operate as a Capacitance Sigma-Delta Modulator (CSD) circuit to measure self-capacitances of the electrodes in respective stages as described herein. Alternatively, the components can be organized and configured to operate as other capacitance-to-digital converters or other types of sensing circuits.

In some embodiments, including automotive products, outdoor products, white appliances, or the like, the capacitance sensing applications that use the touch-button 100 and processing device 101 may require the rejection of large grounded water droplets. These applications must also operate in a regular sensing mode and reject small water droplets. The touch button 100 and the processing device 101 may be configured in a ratiometric capacitance sensor construction and perform a measuring method that is insensitive to large grounded water droplets. The ratiometric capacitance sensor includes several electrodes that scan in a special way. The relation between the self-capacitance measurements can be used to determine the respective states of the electrodes of the touch button 100.

Figure 2A:
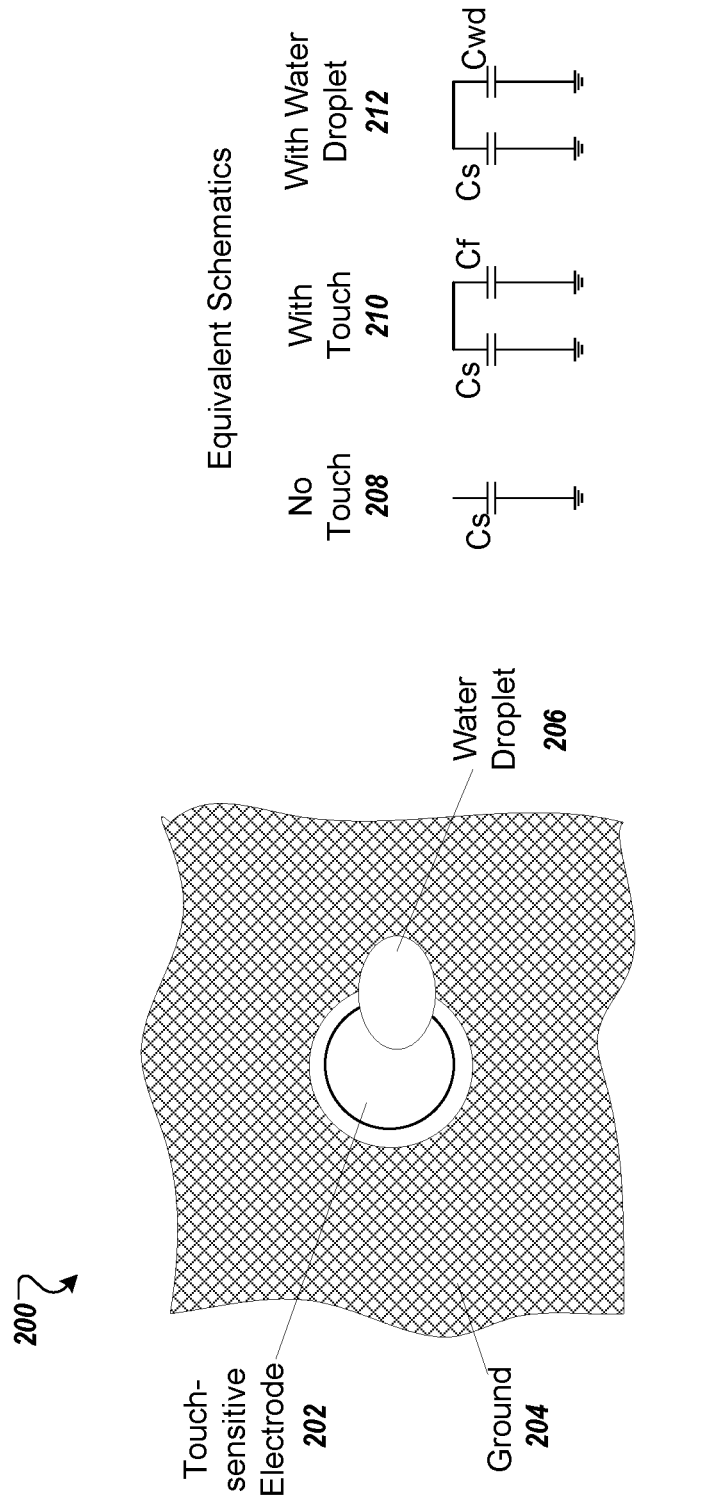
FIG. 2A illustrates a single-electrode touch button with a touch-sensitive electrode surrounded by a ground shield and equivalent schematics of a touch, no touch, and a water droplet according to one embodiment.

FIG. 2A illustrates a single-electrode touch button 200 with a touch-sensitive electrode 202 surrounded by a ground shield 204 according to one embodiment. FIG. 2A also illustrates equivalent schematics of a "no touch" 208 on the touch button 200, a "touch" 210 on the touch button 200, and a water droplet 212 on the touch button 200 according to one embodiment. The touch-sensitive electrode 202 is sensitive to water droplets, like water droplet 206. As shown by the equivalent schematics with the touch 210 and with the water droplet 212, the touch and the water droplet 206 provoke similar capacitance responses. Water has a high dielectric constant and can be a conductor. The capacitance due to water droplets (labeled Cwd) can be higher than the minimal capacitance due to finger touch (labeled Cf).

Figure 2B:
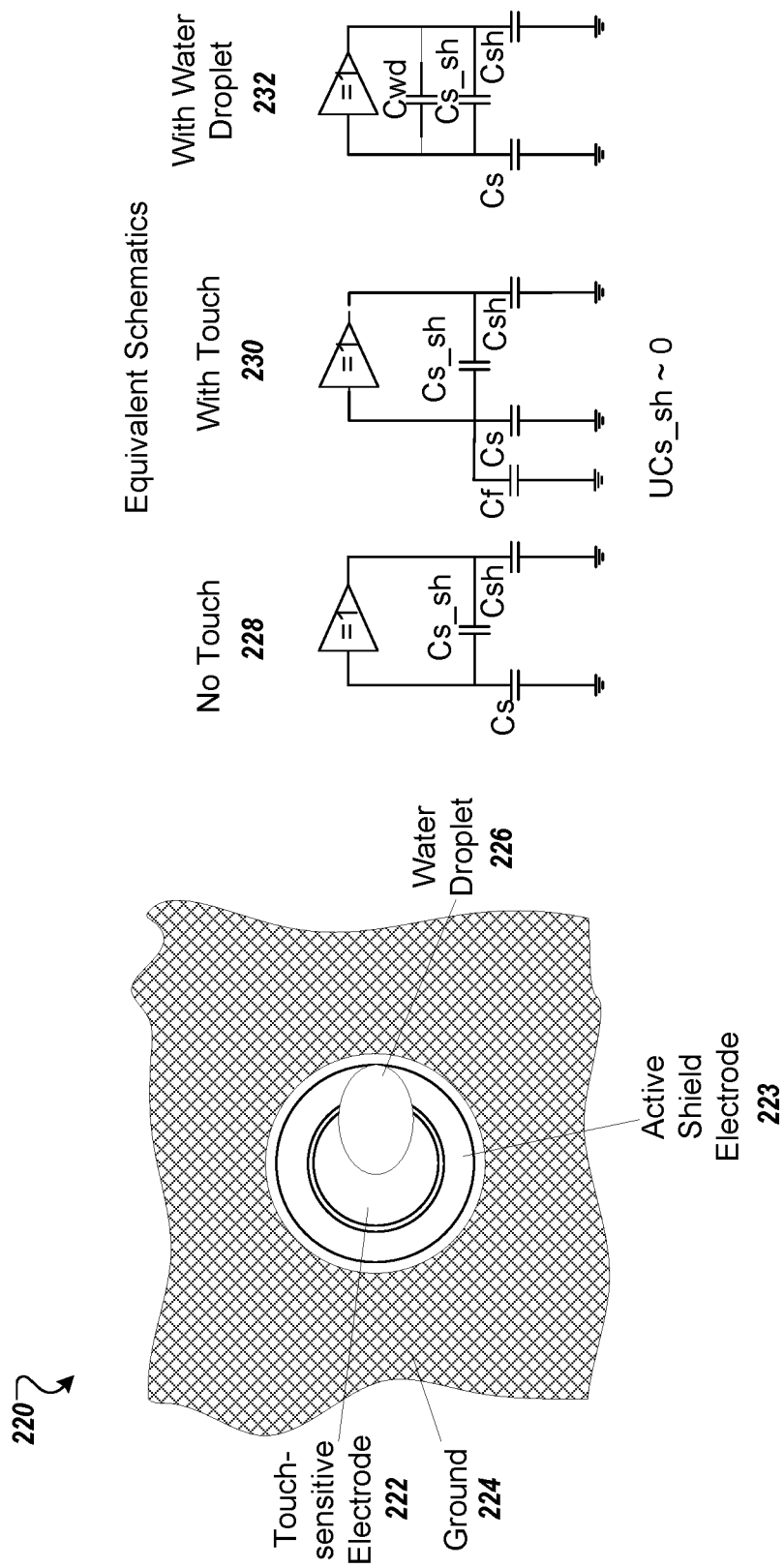
FIG. 2B illustrates a two-electrode touch button with a touch-sensitive electrode surrounded by an active shield electrode and a ground shield and equivalent schematics of a touch, no touch, and a water droplet according to one embodiment.

To eliminate the impact of the water-droplet 206, one solution uses an additional electrode placed around the touch-sensitive electrode 202 and is driven by a signal that is a buffered copy of the signal on the touch-sensitive electrode 202, as shown in FIG. 2B.

FIG. 2B illustrates a two-electrode touch button 220 with a touch-sensitive electrode 222 surrounded by an active shield electrode 223 and a ground shield 224 according to one embodiment. FIG. 2B also illustrates equivalent schematics of a "no touch" 228 on the touch button 220, a "touch" 230 on the touch button 220, and a water droplet 232 on the touch button 220 according to one embodiment. The additional electrode is called the "active shield" electrode 223. The voltage waveforms on both electrodes are identical. As such, a mutual capacitance of these electrodes (labeled Cs_sh) doesn't affect the sensor measurement capacitance. Therefore, a non-grounded water droplet 226 that partially covers both electrodes doesn't impact the sensor measurement capacitance. Yet, if a water droplet is too big, its influence can provoke false touches because the corresponding capacitance (Cwd) caused the water droplet becomes large enough to represent the capacitance of a conductive object (e.g., a finger).

Figure 2C:
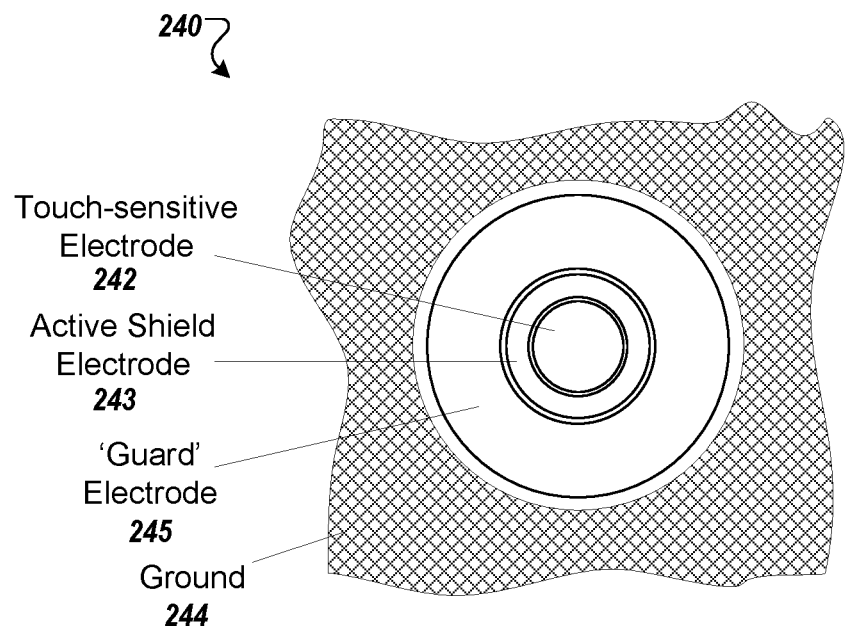
FIG. 2C illustrates a three-electrode touch button with a touch-sensitive electrode surrounded by an active shield electrode, a guard electrode, and a ground shield according to one embodiment.

FIG. 2C illustrates a three-electrode touch button 240 with a touch-sensitive electrode 242 surrounded by an active shield electrode 243, a guard electrode 245, and a ground shield 244 according to one embodiment. The three electrodes of the touch button 240 can be scanned using a two-step process. In a first step, a control procedure activates the active shield electrode 243 and scans the touch-sensitive electrode 242. Scanning the touch-sensitive electrode 242 together with the active shield electrode 243 rejects the impact of water droplets between the touch-sensitive electrode 242 and the ground shield 244. In a second step, a control procedure scans only the guard electrode 345. If a water droplet is large and covers all the three electrodes, the signal from the guard electrode 345 increases over some threshold value. Therefore, the control procedure blocks touch-event activation. Usually, the guard electrode 345 is much larger than the touch-sensitive electrode 242 and active shield electrode 243. If the user touches the guard electrode 345, a touch response is lower than a response to large water droplets. Although this three-electrode touch button construction works well to reject water, the construction uses three electrodes and the guard electrode has to be larger than the other two electrodes. This means that the form factor of the three-electrode touch button may also be quite large. If the form factor is not large, the sensing area of the inner electrode may be too small for reliable sensing.

Figures 3A, 3B, 3C:
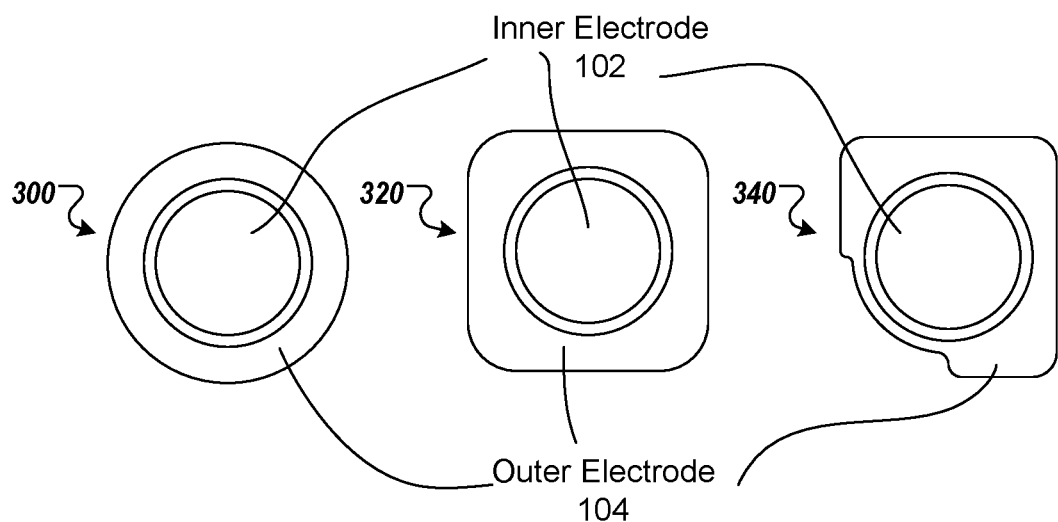
FIG. 3A-3C illustrates two-electrode touch buttons with different shapes according to multiple embodiments.

FIG. 3A-3C illustrates two-electrode touch buttons with different shapes according to multiple embodiments. In FIG. 3A, the inner electrode 102 and the outer electrode 104 are concentric circles with a common center. The outer electrode 104 completely surrounds the inner electrode 104. The inner electrode 102 may be a solid circle or a ring and the outer electrode 104 may be a ring that surrounds the solid circle or ring of the inner electrode 102. In FIG. 3B, the inner electrode 102 is a solid circle and the outer electrode 104 is a square shape with rounded corners. The square shape has a cutout in which the inner electrode 102 is disposed. In another embodiment, the square shape may be rectangular or may not have rounded corners as illustrated. In FIG. 3C, the inner electrode 102 is a solid circle and the outer electrode 104 has a similar square shape as in FIG. 3B, but one of the corners is removed. The outer electrode 104 substantially surrounds the inner electrode 102. In FIGS. 3A-3C, the surface area of the inner electrode 102 and the outer electrode 104 is smaller than a surface area of a three-electrode touch button as described herein. In one embodiment, the inner electrode 102 has a surface area that is the same as or similar to a surface area of the outer electrode 104. Alternatively, other shapes and sizes of electrodes may be used for various applications that require certain button size requirements while still providing a waterproof property.

Touch button 100 can be used in a multi-stage capacitance measurement process to determine whether the touch button has been pressed even when water droplets are present on the touch button 100.

FIG. 4 is a block diagram an electronic system 400 that measures capacitances of a touch button 100 according to one embodiment. The electronic system 400 includes the touch button 100, which includes the inner electrode 102 and the outer electrode 104. In one embodiment, the touch button 100 is a ratiometric touch button. Alternatively, the touch button 100 is not considered ratiometric. The electronic system 400 also includes a processing device 406 that includes configurable analog multiplexers 408 and a CDC 410. In one embodiment, the CDC 410 is a CDC 410. Alternatively, the CDC 410 is other types of capacitance-to-digital converters or other types of capacitance conversion circuits, such as charge transfer circuits, charge accumulation circuits, or the like. The CDC 410, in connection with the configurable analog multiplexer 408 can be one example of a capacitance measurement circuit that outputs digital values to a processing element, such a central processing unit (CPU) (not illustrated in FIG. 4). The configurable analog multiplexers 408 may correspond to selection circuit 108 of FIG. 1. Alternatively, the processing device 406 may use other circuit configurations to measure capacitance and digitize the measured capacitance as described herein.

In the depicted embodiment, the CDC 410 includes a programmable current source 412, a driver 414, a comparator 416, a flip-flop 418, a decimator 420, and a modulator capacitor 422. The programmable current source 412 can be selectively coupled to a first node 411 via a switch 424. The driver 414 includes an input coupled to a voltage reference 413 and an output selectively coupled to a second node 415. The comparator 416 is coupled to the first node 411 and the voltage reference 413. The flip-flop 418 is coupled to an output of the comparator 416. The decimator 420 is coupled to an output of the flip-flop 418 and selectively coupled to the first node 411. The input into the decimator 420 is also coupled to a feedback control line 401 that controls the switch 424. The modulator capacitor 422 is coupled between the first node 411 and a ground node (hereinafter referred to as "ground").

In the depicted embodiment, the configurable analog multiplexer 408 includes two multiplexer circuits: a first multiplexer 426 coupled to the inner electrode 102 and a second multiplexer 428 coupled to the outer electrode 102. The first multiplexer 426 selectively couples the inner electrode 102 to a third node 417 in a first stage of the multi-stage capacitance measurement process and selectively couples the inner electrode 102 to a fixed voltage node in a second stage of the multi-stage capacitance measurement process. In one embodiment, the fixed voltage node is a ground terminal as depicted in FIG. 4. The second multiplexer 428 selectively couples the outer electrode 404 to the second node 415 in the first stage and selectively couples the outer electrode 104 to the third node 417 in the second stage. In another embodiment, a single multiplexer circuit with two outputs and four inputs can be used. Alternatively, other selection circuits may be used.

In the depicted embodiment, the CDC 410 also includes a first switch 430 (labeled Ph1) coupled between the first node 411 and the third node 417 and a second switch 432 (labeled Ph2) coupled between the third node 417 and ground. The first switch 430 connects the first node 411 and the third node 417 in a first phase of the CDC 410. The second switch 432 grounds the third node 417 in a second phase of the CDC 410. The CDC 410 also includes a third switch 434 coupled between the driver 414 and the second node 415 and a fourth switch 436 coupled between the second node 415 and ground. The third switch 434 drives the voltage reference 413 on the second node 415 in the first phase and the fourth switch 436 grounds the second node 415 in the second phase.

As depicted, the touch button 100 includes two electrodes: inner electrode 102 as a touch-sensitive electrode and the outer electrode 104 as a "guard" electrode that blocks the touch-event activation. The electrodes shapes can be different in different combinations as illustrated in the examples of FIGS. 3A-3C.

Although the proposed touch button construction looks similar to the touch button with an "active shield" electrode, it is different because the outer electrode 104 is being used as a sensor according to the sensor scanning procedure as described in the two different stages of the multi-stage capacitance measurement processes described below.

In a first process, the touch button 100 is scanned two times in different modes and configurations. The final result uses combined data from the two scans. In a first mode, the inner electrode 102 (touch-sensitive electrode or touch electrode), is scanned in a self-capacitance mode of the CDC 410 and the outer electrode 104 is driven by the active shield signal (e.g., voltage reference 413). In a second mode, the outer electrode 104 (also referred to as outer sensor), is scanned in the self-capacitance mode of the CDC 410 and the inner electrode 102 is connected to ground.

In one embodiment, the sensitivity of both sensors (electrodes 102, 104) is tuned in such a way that when a finger touches the central part of the touch button 100, the signal from the inner electrode 102, is higher than signal from the outer electrode 104. And when the finger is located proximate to a button edge, the signal from the outer electrode 104 is higher than the signal from the inner electrode 102. The relation between the self-capacitance measurements (e.g., first and second self-capacitance measurements output from the decimator 420 in the first and second modes, respectively) is used as informative data about the sensor states.

Figure 5A:
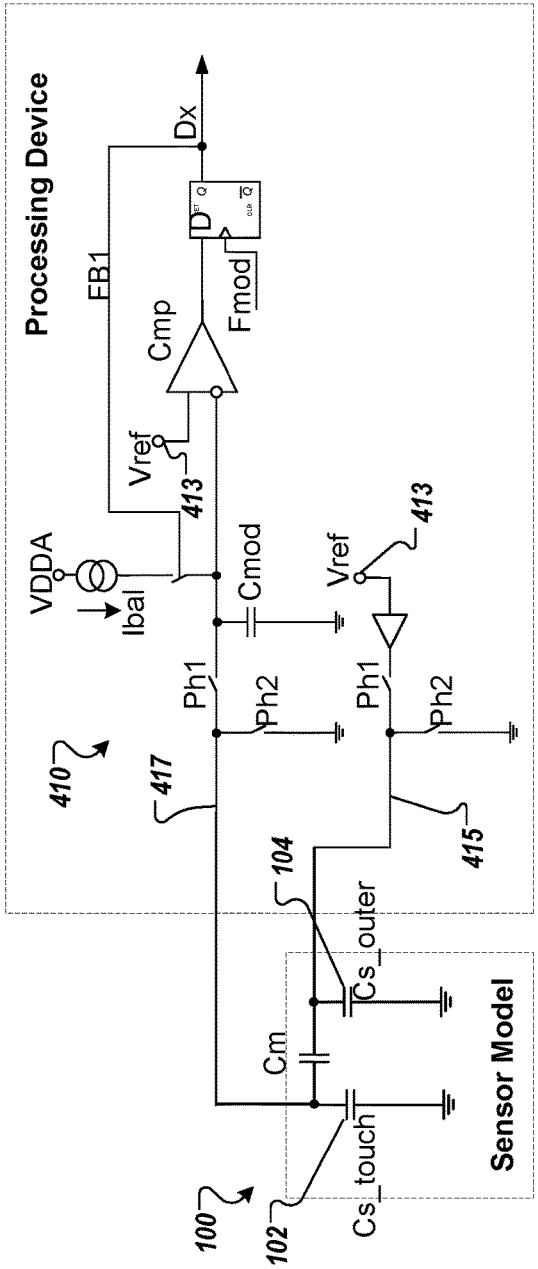
FIG. 5A is a block diagram of a first configuration of a capacitance-to-digital converter (CDC) in a first stage according to one embodiment.
Figure 5B:
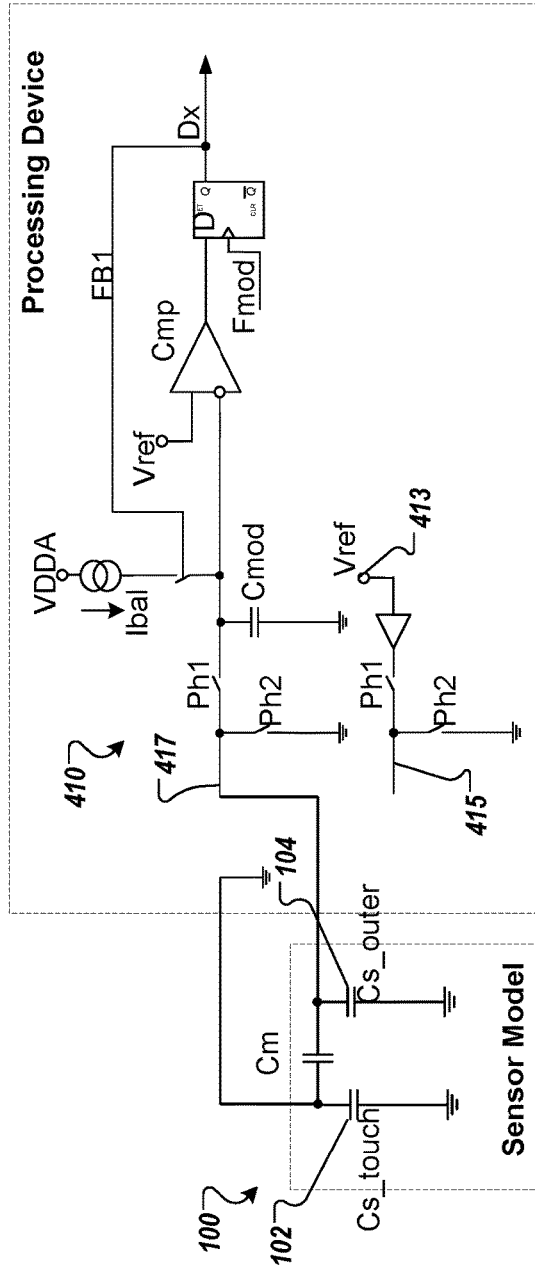
FIG. 5B is a block diagram of a second configuration of the CDC in a second stage according to one embodiment.

As described herein, the touch button 100 can be scanned one or more times while the CDC 410 is in each of multiple different configurations, as illustrated in FIGS. 5A-5B. The final result uses combined data from the multiple scans.

FIG. 5A is a block diagram of a first configuration of the CDC 410 in a first stage 510 according to one embodiment. In the first stage 510, the CDC 410 is set to the first configuration in which the inner electrode 102 is coupled to the third node 417 while the outer electrode 104 is coupled to the second node 415. The CDC 410 in the first configuration measures a first self-capacitance of the inner electrode 102 while the outer electrode 104 is driven by the active shield signal, reference voltage 413.

FIG. 5B is a block diagram of a second configuration of the CDC 410 in a second stage 520 according to one embodiment. In the second stage 520, the CDC 410 is set to the second configuration in which the outer electrode 104 is coupled to the third node 417 while the inner electrode 102 is coupled to ground. The CDC 410 in the second configuration measures a second self-capacitance of the outer electrode 104 while the inner sensor 102 is grounded (or coupled to a fixed voltage node).

Figure 6A:
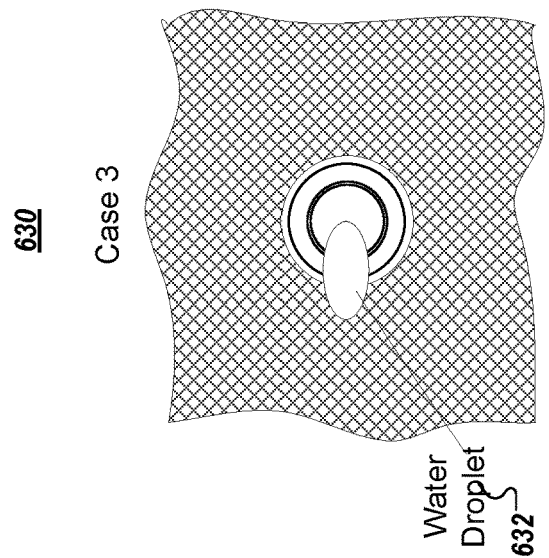
FIGS. 6A-6C illustrate three cases of water droplets located at different places of the touch button according to various embodiments.
Figure 6B:
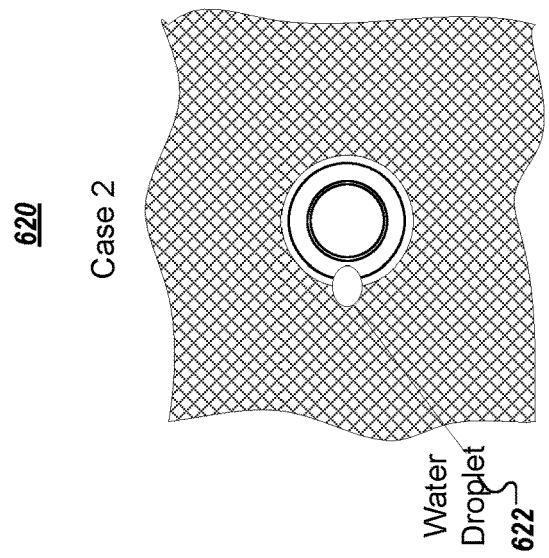
Figure 6C:
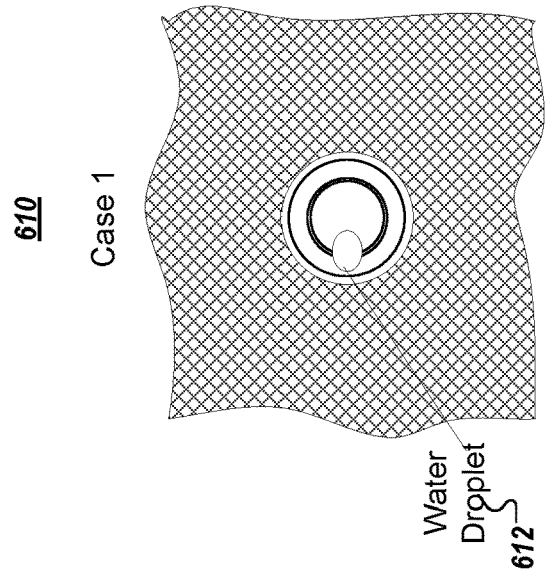

As noted herein, the sensitivity of both electrodes 102, 104 may be tuned in such a way that when a finger touches the central part (the inner electrode 102) of the touch button 100, the signal from the inner electrode 102 is higher than the signal from the outer electrode 104. When the finger is displaced to the button edge, the signal from the outer electrode 104 is higher than the signal from the inner electrode 102. The relation (e.g., ratio, difference, or the like) between the two electrode capacitance measurements is used as informative data about the sensor states. For example, in a case 610 where one or more water droplets 612 are small and are located only between the inner electrode 102 and outer electrode 104, as illustrated in FIG. 6A, the water droplet 612 is invisible due to active shielding by voltage reference 413. In another case 620 where one or more water droplets 622 are located only between the outer electrode 104 and ground shielding around the outer electrode 104, as illustrated in FIG. 6B, the capacitance of the outer electrode 104 increases higher than the capacitance of the inner electrode 102. Thus, the presence of water droplets 622 can be accounted for using the relation between the measured capacitances of the two electrodes, blocking any touching events that are caused by water. In another case 630 where one or more water droplets 632 are located across both electrodes and are grounded, as illustrated in FIG. 6C, the signal response of the outer electrode 104, due to the water presence, is higher or equal to the signal response of the inner electrode 102. This happens because the outer electrode 104 is placed nearer to ground than the inner electrode 102. The relation between the measured electrode capacitance decreases and any touching events are blocked. This response is similar to when the thickness of the overlay material is not high relative to the electrode size This means that the sensor size (both electrodes but mostly the inner electrode) has to increase along with the sensor overlay thickness. Using the touch button construction described herein, the size of the electrodes and the overlay thickness does not have to increase to reduce or eliminate the effect of water. The same result of sensing data processing happens if water droplets are big and cover both electrodes. The touch event is activated only if both sensors' signals are higher than respective thresholds and the relation or/and difference between the sensors' signals is higher than a corresponding threshold.

In a second multi-stage capacitance measurement process, the inner electrode 102 and outer electrode 104 are scanned simultaneously by ratiometric or multi-phase self-capacitance methods of the CS block 410. The touch button is designed in such a way that the capacitances of the inner and outer electrodes are approximately the same and the relation between these capacitances does not depend on properties of the overlay material. The ratiometric and multi-phase self-capacitance methods reject the impact of water droplets between the touch electrode and ground shield. If water droplets become large and cover the entire surface area of the two electrodes, both electrodes' capacitances change in a similar way and the relation between these electrodes' capacitances does not change significantly, blocking touch-activation events caused by the water.

The following methods (processes 700, 800, and 900) may be performed by processing logic (e.g., processing element 1002, processing device 1001, multi-configuration capacitance measurement circuit 106, or the like) that may include hardware (circuitry, dedicated logic, etc.), software (such as is run on a general purpose computing system or a dedicated machine), firmware (embedded software), or any combination thereof. In one embodiment, the processing device 101 performs some or all of each method disclosed above. In another embodiment, water rejection logic 114 performs some or all of each method. In another embodiment, the host 150 performs some or all of the operations each method. Alternatively, other components of the electronic systems described herein perform some or all of the operations of each of the methods. It should be noted that in some instances the processing logic 1002 or the processing logic may send control signals to the selection circuit and/or to the various switches to couple the corresponding electrodes. That is, when the processing logic couples, selectively couples, or decouples electrodes from the capacitance-to digital conversion circuit, the processing logic can send control signals, set registers, send commands, send instructions, or the like to couple the electrodes to the sensing circuit as described herein. It should also be noted that the processing element, processing logic, or the like can be integrated with the selection circuit and the capacitance-to digital conversion circuit, such as using a hardware accelerator type circuit.

Figure 7:
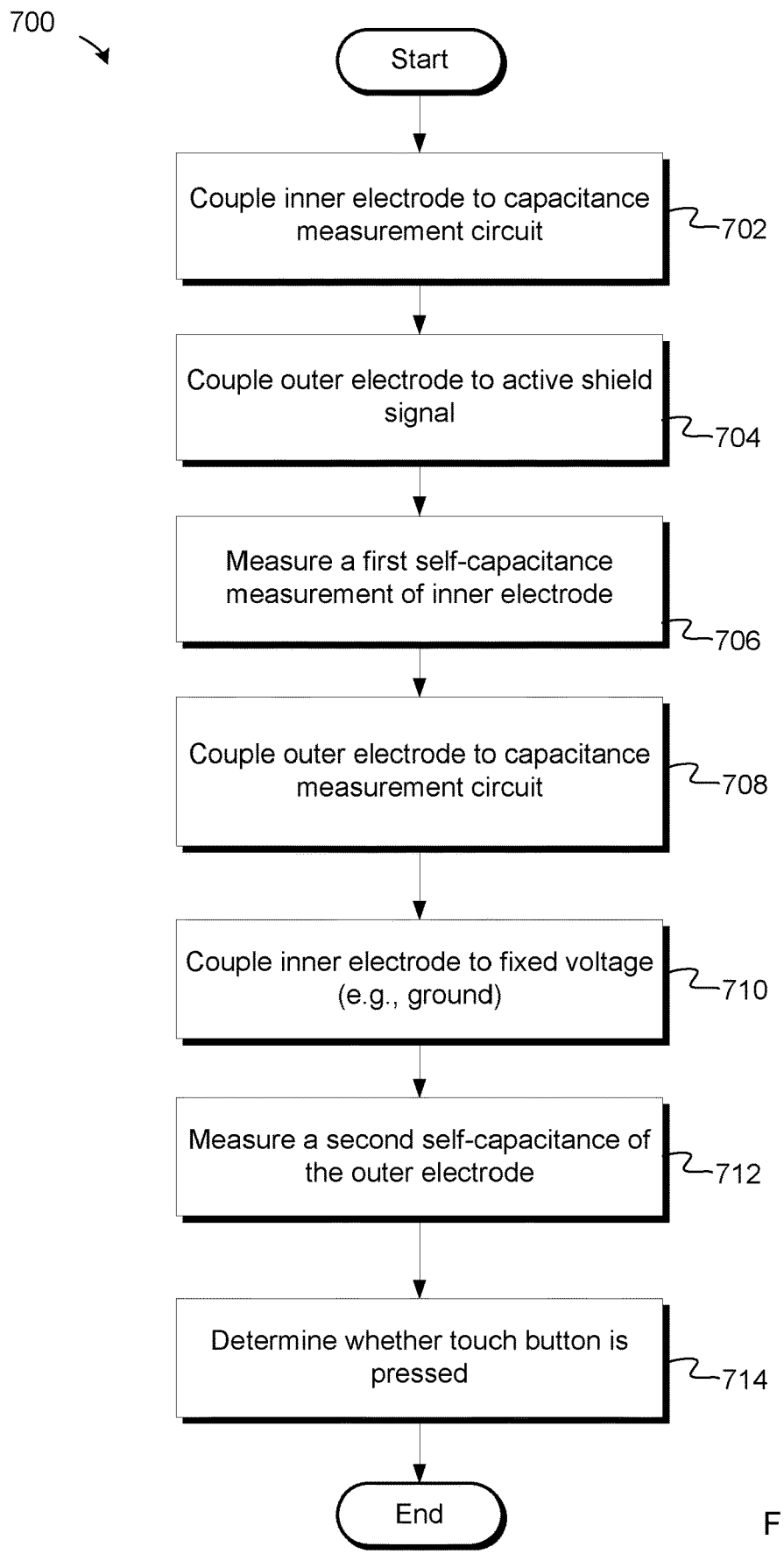
FIG. 7 is a flow diagram of a multi-stage capacitance measurement process for determining whether a two-electrode touch button is pressed according to one embodiment.

FIG. 7 is a flow diagram of a multi-stage capacitance measurement method 700 for determining whether a two-electrode touch button is pressed according to one embodiment. The multi-stage capacitance measurement method 700 starts with processing logic coupling an inner electrode of a two-electrode touch button to a capacitance measurement circuit in a first stage of a two-stage measurement process (block 702). That is, the inner electrode is coupled to an input channel (also referred to as a receive (RX) input node). The processing logic couples an outer electrode of the two-electrode button to an active shield signal in the first stage (block 704). The inner electrode may be substantially surrounded by the outer electrode. At block 706, the processing logic measures (e.g., using a capacitance measurement circuit) a first self-capacitance measurement of the inner electrode while the active shield is coupled to the outer electrode in the first stage. The processing logic, before or after the first stage, couples the outer electrode to the capacitance measurement circuit in a second stage of the two-stage measurement process (block 708). That is, the outer electrode is coupled to the input channel. The processing logic couples the inner electrode to a fixed voltage in the second stage (block 710). At block 712, the processing logic measures (e.g., using the capacitance measurement circuit) a second self-capacitance measurement of the outer electrode while the fixed voltage is coupled to the inner electrode. After measuring the first and second self-capacitance measurements, the processing logic determines whether the two-electrode touch button is pressed using the first self-capacitance measurement and the second self-capacitance measurement (block 714), and the method 700 ends. As described herein, the processing logic may be implemented in the processing element 112 of FIG. 1. In such case, the processing logic controls the multi-configuration capacitance measurement circuit 106 to measure the first and second self-capacitance measurements. Once measured, the processing logic can determine whether the two-electrode touch button is pressed using these measurements. For example, the processing logic can send control signals to the selection circuit 108 and the capacitance-to digital conversion circuit 110.

In a further embodiment, the processing logic further compares the first self-capacitance measurement against a first enable threshold and the second self-capacitance measurement against a second enable threshold. The processing logic can calculate a difference value between the first self-capacitance measurement and the second self-capacitance measurement and compare the difference value against a third enable threshold. The processing logic detects activation of the two-electrode touch button as being pressed when 1) the first self-capacitance measurement is greater than the first enable threshold, 2) the second self-capacitance measurement is greater than the second enable threshold, and 3) the difference value is greater than the third enable threshold; otherwise, the processing logic detects deactivation of the two-electrode touch button as not being pressed when any one of 1), 2), or 3) is false. In other words, the processing logic detects deactivation of the two-electrode touch button when the first self-capacitance measurement is not greater than the first enable threshold, the second self-capacitance measurement is not greater than the second enable threshold, or the difference value is not greater than the third enable threshold. It should be noted that detecting activation may also be referred to as enabling an operation when the two-electrode touch button is activated, whereas detecting deactivation means that the two-electrode touch button should not be treated as not being activated even though the two-electrode touch button is still enabled.

In another embodiment, the processing logic resets stored attributes of the two-electrode touch button when 1) a water flag is set in a first pass of the process. The processing logic resets the stored attributes when 2) the first self-capacitance measurement is not greater than a touch noise threshold and 3) the second self-capacitance measurement is greater than the second enable threshold. The processing logic resets the stored attributes when 4) the water flag is set and 5) the second self-capacitance measurement is less than half a water enable threshold. The processing logic sets the water flag when 6) the second self-capacitance measurement is greater than the water enable threshold and 7) the first self-capacitance measurement is greater than the second enable threshold. The processing logic detects deactivation of the two-electrode touch button as not being pressed when 7) is false. That is the processing logic detects deactivation of the two-electrode touch button as not being pressed when the first self-capacitance measurement is not greater than the second enable threshold.

In a further embodiment, the processing logic compares the first self-capacitance measurement against a first enable threshold and the second self-capacitance measurement against a second enable threshold. The processing logic computes and compares a ratio of the first self-capacitance measurement and the second self-capacitance measurement against a third enable threshold. The processing logic detects activation of the two-electrode touch button as being pressed when 1) the first self-capacitance measurement is greater than the first enable threshold, 2) the second self-capacitance measurement is greater than the second enable threshold, and 3) the ratio is greater than the third enable threshold; otherwise, the processing logic detects deactivation of the two-electrode touch button as not being pressed when any one of 1), 2), or 3) is false. In other words, the processing logic detects deactivation of the two-electrode touch button when the first self-capacitance measurement is not greater than the first enable threshold, the second self-capacitance measurement is not greater than the second enable threshold, or the ratio is not greater than the third enable threshold.

In another embodiment, the processing logic the processing logic compares the first self-capacitance measurement against a first enable threshold and the second self-capacitance measurement against a second enable threshold. The processing logic computes a difference value and compares the difference value between the first self-capacitance measurement and the second self-capacitance measurement against a third enable threshold. The processing logic computes a ratio and compares the ratio of the first self-capacitance measurement and the second self-capacitance measurement against a third enable threshold. The processing logic detect activation of the two-electrode touch button as being pressed when 1) the first self-capacitance measurement is greater than the first enable threshold, 2) the second self-capacitance measurement is greater than the second enable threshold, 3) the difference value is greater than the third enable threshold, and 4) the ratio is greater than the third enable threshold; otherwise, the processing logic detects deactivation of the two-electrode touch button as not being pressed when any one of 1), 2), 3), or 4) is false. In other words, the processing logic detects deactivation of the two-electrode touch button when the first self-capacitance measurement is not greater than the first enable threshold, the second self-capacitance measurement is not greater than the second enable threshold, the difference value is not greater than the third enable threshold, or the ratio is not greater than the fourth enable threshold.

Figure 8:
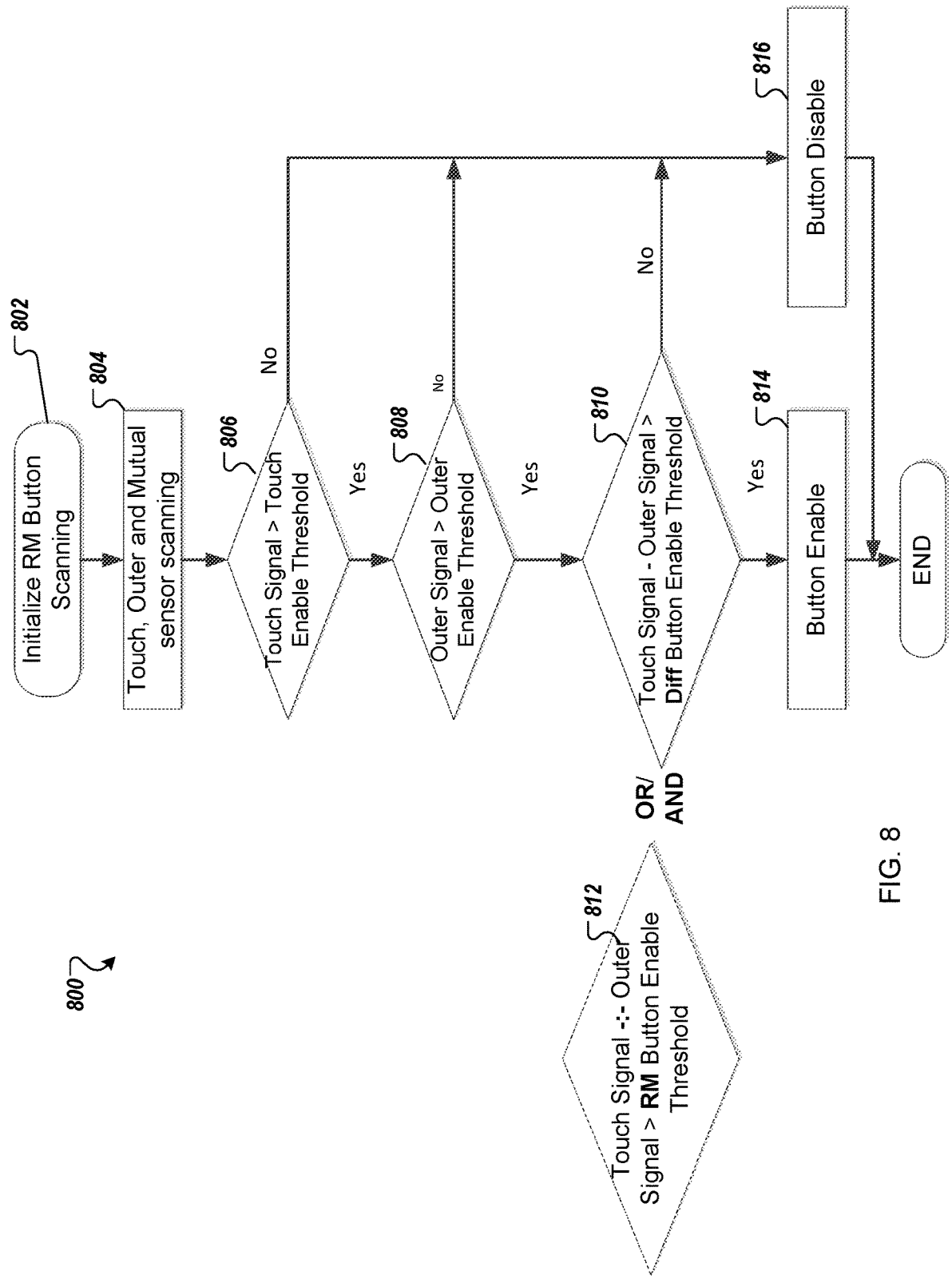
FIG. 8 is a flow diagram of a multi-stage capacitance measurement method according to another embodiment.

FIG. 8 is a flow diagram of a multi-stage capacitance measurement method 800 according to another embodiment. The method 800 begins by the processing logic initializing the ratiometric button scanning (block 802). The processing logic performs a touch sensor scan, an outer sensor scan, and a mutual sensor scan (block 804). The touch sensor scan may include measuring a first self-capacitance of the inner electrode 102 while applying a shield signal to the outer electrode 104. The touch sensor scan results in a touch signal. The outer sensor scan may include measuring a second self-capacitance of the outer electrode 104 while applying a fixed voltage, such as ground, to the inner electrode 102. The outer sensor scan results in an outer signal. The mutual sensor scan may include measuring a mutual capacitance between the inner electrode 102 and the outer electrode 104. The mutual sensor scan results in a mutual touch signal. The processing logic may also compute a difference signal between the touch signal and the outer signal.

At block 806, the processing logic compares the touch signal against a touch enable threshold. If the touch signal is not greater than the touch enable threshold, the processing logic detects deactivation of the touch button (block 816) and the method 800 ends. If the touch signal is greater than the touch enable threshold, the processing logic proceeds to block 808. At block 808, the processing logic compares the outer signal against an outer enable threshold. If the outer signal is not greater than the outer enable threshold, the processing logic detects deactivation of the touch button (block 816) and the method 800 ends. If the outer signal is greater than the outer enable threshold, the processing logic proceeds to block 810. At block 810, the processing logic compares the difference signal against a difference enable threshold. If the difference signal is not greater than the difference enable threshold, the processing logic detects deactivation of the touch button (block 816) and the method 800 ends. If the difference signal is greater than the difference enable threshold, the processing logic enables the touch button (block 814), and the method 800 ends.

In another embodiment, the processing logic, instead of comparing the difference signal at block 810, computes a ratio of the touch signal and the outer signal. The processing logic compares the ratio against a ratiometric enable threshold (block 812). In another embodiment, the processing logic can perform the operation at block 810 and the operation at block 812.

Figure 9B:
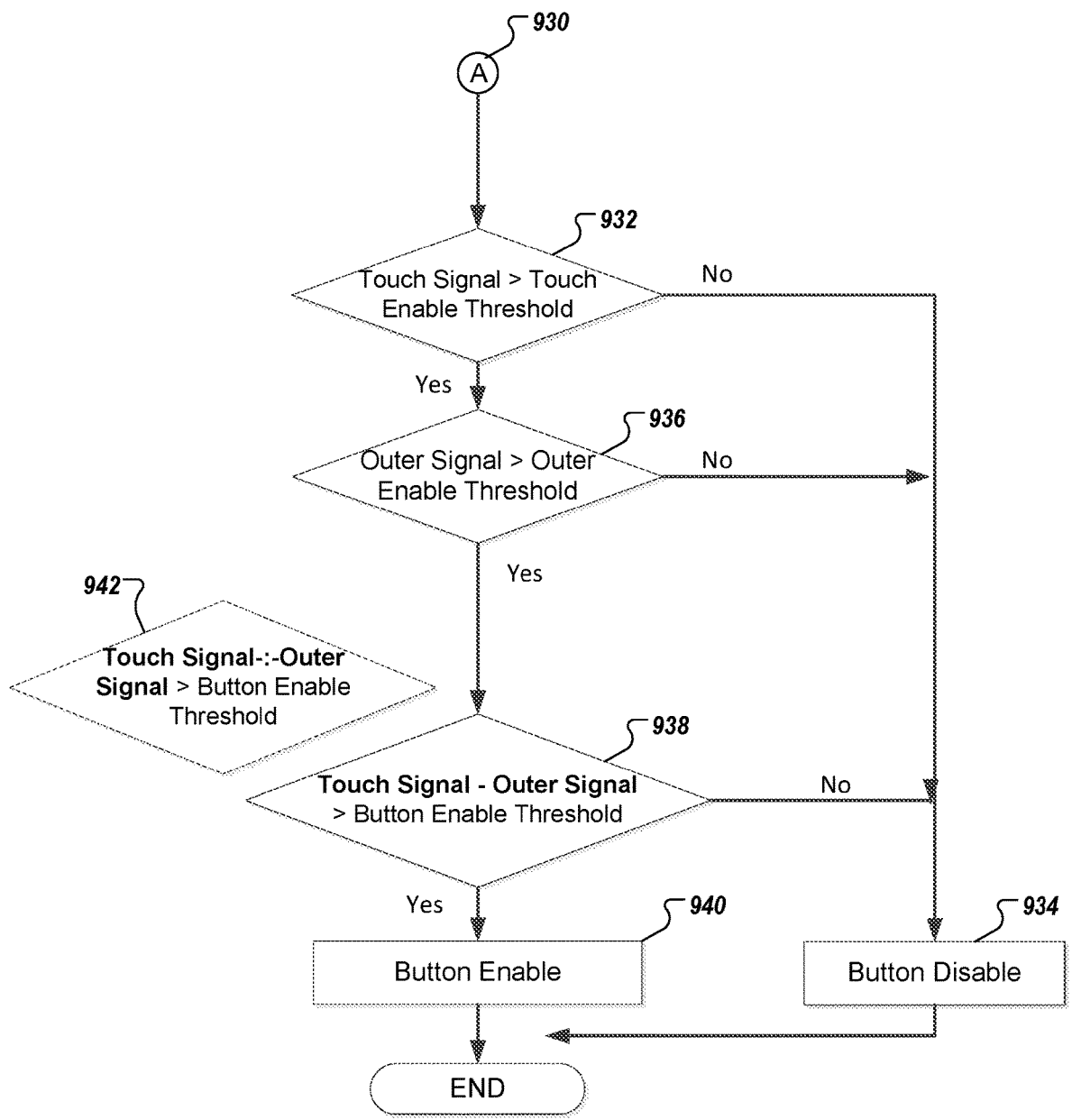

FIGS. 9A-9B are flow diagrams of a multi-stage capacitance measurement method 900 according to one embodiment. The method 900 begins by the processing logic initializing the ratiometric button scanning (block 902). The processing logic performs a touch sensor scan, an outer sensor scan, and a mutual sensor scan (block 904). The touch sensor scan may include measuring a first self-capacitance of the inner electrode 102 while applying a shield signal to the outer electrode 104. The touch sensor scan results in a touch signal. The outer sensor scan may include measuring a second self-capacitance of the outer electrode 104 while applying a fixed voltage, such as ground, to the inner electrode 102. The outer sensor scan results in an outer signal. The mutual sensor scan may include measuring a mutual capacitance between the inner electrode 102 and the outer electrode 104. The mutual sensor scan results in a mutual touch signal. The processing logic may also compute a difference signal between the touch signal and the outer signal. Alternatively, the process may not perform the mutual sensor scan.

At block 906, the processing logic determines whether a water flag is already set. If so, the processing logic resets touch sensor attributes (block 908). These touch sensor attributes may include a baseline value and a current difference between the baseline value and a current sensor signal value and proceeds to block 910. If the water flag is not set at block 906, the processing logic proceeds to block 910. At block 910, the processing logic compares the touch signal against a touch noise threshold. If the touch signal is greater than the touch noise threshold, the processing logic compares the outer signal against an outer enable threshold (block 912). If the touch signal is not greater than the outer enable threshold at block 912, the processing logic resets the touch sensor attributes (block 914) and proceeds to block 916. If the outer signal is greater than the outer enable threshold at block 912, the processing logic proceeds to block 916. At block 916, the processing logic determines if the water flag is set. If the water flag is set, the processing logic compares the outer signal against a water enable threshold (block 918). If the outer signal is less than half the water enable threshold at block 918, the processing logic resets the water flag and resets the outer sensor attributes (block 920) and proceeds to block 922. If the outer signal is not less than half of the water enable threshold at block 918, the processing logic proceeds to block 922. If the water flag is not set at block 916, the processing logic proceeds to block 922. At block 922, the processing logic compares the outer signal against the water enable threshold. If the outer signal is greater than the water enable threshold at block 922, the processing logic compares the touch signal against the touch enable threshold (block 924). If the touch signal is not less than the touch enable threshold at block 924, the processing logic proceeds to block 930 (continued at FIG. 9B), which proceeds to block 932 to detect deactivation of the touch button and the method 900 ends. If the touch signal is less than the touch enable threshold, the processing logic sets the water flag (block 926) and proceeds to block 930 (continued at FIG. 9B). Also, if the outer signal is not greater than the water enable threshold at block 922, the processing logic proceeds to block 930.

At block 930, the processing logic compares the touch signal against the touch enable threshold. If the touch signal is not greater than the touch enable threshold at block 932, the processing logic detects deactivation of the touch button at block 934 and the method 900 ends. If the touch signal is greater than the touch enable signal at block 932, the processing logic compares the outer signal against the outer enable threshold (block 936). If the outer signal is not greater than the outer enable threshold, the processing logic detects deactivation of the touch button at block 934 and the method 900 ends. If the outer signal is greater than the outer enable threshold at block 936, the processing logic compares a difference signal between the touch signal and the outer signal against a button enable threshold (block 938). If the difference signal is not greater than the button enable threshold at block 938, the processing logic detects deactivation of the touch button at block 934 and the method 900 ends. If the difference signal is greater than the button enable threshold at block 938, the processing logic detects activation of the touch button (block 940) and the method 900 ends.

In another embodiment, the processing logic, instead of comparing the difference signal at block 938, computes a ratio of the touch signal and the outer signal. The processing logic compares the ratio against a ratiometric enable threshold (block 942). In another embodiment, the processing logic can perform the operation at block 938 and the operation at block 942.

In one embodiment, the thresholds can be defined by the sensor construction and can be tuned accordingly. If a water droplet is too big, the common detection process can be wrong and can perform a false touch event. An advanced touch-detection process, like illustrated in FIGS. 9A-9B can include a water detection sub-process. The outer electrode is sensitive to water. Usually, this sensor signal response to water is lower than a response to a touch. The detection algorithm detects water on the sensor and activates a touch sensor re-initiated procedure. This procedure resets the touch sensor attributes. These attributes may include a baseline value and current difference between the baseline value and current sensor signal value.

As described herein, the embodiments may achieve various improvements, including a reduction in the number of electrodes, a reduction in sensor size, and the ability to detect water on the sensor. The embodiments may improve the baseline tracking procedures. The embodiments described herein can replace the three-electrode touch button waterproof button solution where the size of the sensor is important, as the sensor size can become smaller while still achieving the waterproof capability. The embodiments described herein may also be more reliable than the three-electrode touch button.

The embodiments of a two-electrode sensor construction with a water detection procedure can perform waterproof sensor scanning using neighbor's electrodes' active shielding scanning, multi-phase sensor electrodes' scanning, or both sensor electrodes' simultaneous scanning by two fully synchronous measuring channels. In another embodiment, two electrodes can be scanned using ratiometric scanning. A self-capacitance measuring channel with the active shielding feature can be used. For example, a CDC measuring channel may be used or a ratiometric measuring channel uses the CDC measuring channel or a new ratiometric measuring channel. The embodiments described herein may be used for automotive applications, white goods and appliances that require a waterproof property, an outdoor touch-activated device, a touch button with low overlay-material dependence, or a device with reliable waterproof property, low temperature dependencies. Alternatively, the embodiments may be used in other devices.

Figure 10:
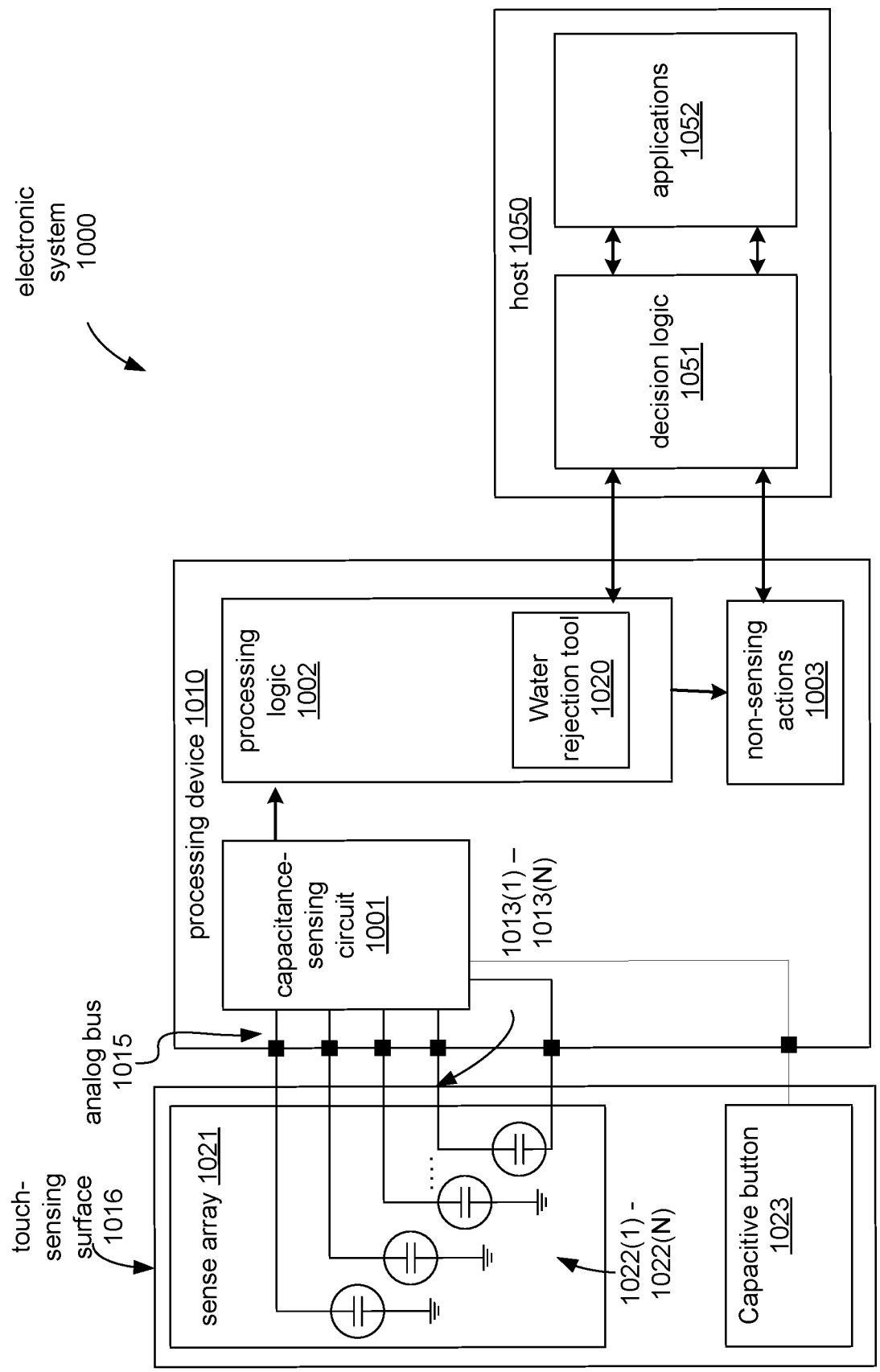
FIG. 10 is a block diagram illustrating an electronic system that processes touch data, according to another embodiment.

FIG. 10 is a block diagram illustrating an electronic system that processes touch data, according to one embodiment. FIG. 10 illustrates an electronic system 1000 including a processing device 1010 that may be configured to measure capacitances from a sense array 1021 (e.g., capacitive-sense array) with water rejection tool 1020, the sensor array 1021 forming a touch-sensing surface 1016. In one embodiment, a multiplexer circuit may be used to connect a capacitance-sensing circuit 1001 with a sense array 1021. The touch-sensing surface 1016 (e.g., a touchscreen or a touch pad) is coupled to the processing device 1010, which is coupled to a host 1050. In one embodiment the touch-sensing surface 1016 is a two-dimensional sense array (e.g., sense array 1021) that uses processing device 1010 to detect touches on the touch-sensing surface 1016.

In one embodiment, water rejection tool 1020 may detect the presence of water proximate to one or more electrodes of a sense array. Water rejection tool 1020 can obtain capacitance data using self-capacitance scanning of an electrode of the sense array. Any two electrodes may be used by processing device 1010 to behave like a touch button. It should be noted that a capacitive sensor may refer to, for example, an electrode of the sense array, a pair of electrodes of the sense array, a button, or any capacitive sensing element. When capacitance measured on an electrode above a touch threshold, the measurement may be registered as a touch on the capacitive button. Water rejection tool 1020 may also obtain capacitance data using mutual-capacitance scanning of a pair of electrodes, such as the electrode scanned for the self-capacitance scanning and another electrode of the electrode pair. As a result, the capacitance data obtained includes a first self-capacitance measurement of the electrode scanned during a first stage of the self-capacitance scanning (hereinafter referred to as self-capacitance electrode for description purposes) and a second self-capacitance measurement during a second stage. Similarly, the capacitance data may include a mutual capacitance measurement of the mutual capacitance between two electrode scanned during mutual capacitance scanning (hereinafter referred to as mutual capacitance electrode pair for description purposes). Water rejection tool 1020 may compare the self-capacitance measurement to a self-capacitance threshold, and compare the mutual capacitance measurement to a mutual capacitance threshold. Water on a touch button has experimentally been shown to strongly affect adjacent mutual capacitance measurements, but weakly affect self-capacitance measurements of electrodes near the water. Water rejection tool 1020 uses this phenomenon to determine if water is on the capacitive button. As described herein, the capacitive data may be used by the water rejection tool 1020 to determine whether water is on the capacitive button. Once water has been sensed on the capacitive button, water rejection tool 1020 may reject the touch activation. In another embodiment, once water has been sensed the water rejection tool 1020 may adapt the touch detection threshold based on water (e.g., water touch detection threshold) so that the water rejection tool 1020 may sense a touch on the button even though the button is wet. The touch detection threshold is a capacitance value (e.g., 1060 counts) above which measured capacitance data from the sense array (e.g., sense array 1021) indicates a touch, and below which no touch is registered. For example, if a measured capacitance value exceeds the touch detection threshold, the water rejection tool 1020 indicates a touch for the respective electrode. If a measured capacitance value is lower than the touch detection threshold, the water rejection tool 1020 indicates no touch is sensed for the respective electrode. It should be noted that water on a capacitive sense array typically increases the capacitive measurements for the electrodes immediately submersed under the water. As such, water may appear to a sensing device as a touch (e.g., false touch) and a sensing device may not be able to differentiate between water and an actual touch. The embodiments described herein may be used to differentiate between water and an actual touch.

In one embodiment, the sense array 1021 includes electrodes 1022(1)-1022(N) (where N is a positive integer) that are disposed as a two-dimensional matrix (also referred to as an XY matrix). The sense array 1021 is coupled to pins 1013(1)-1013(N) of the processing device 1010 via one or more analog buses 1015 transporting multiple signals. In sense array 1021, the first three electrodes (i.e., electrodes 1022(1)-(3)) are connected to capacitance-sensing circuit 1001 and to ground, illustrating a self-capacitance configuration. The last electrode (i.e., 1022(N)) has both terminals connected to capacitance-sensing circuit 1001, illustrating a mutual capacitance configuration. It should be noted that the other electrodes 1022 can have both terminals connected to capacitance-sensing circuit 1001 as well. In an alternative embodiment without an analog bus, each pin may instead be connected either to a circuit that generates a transmit (TX) signal or to an individual receive (RX) sensor circuit. The sense array 1021 may include a multi-dimension capacitive sense array. The multi-dimension sense array includes multiple sense elements, organized as rows and columns. In another embodiment, the sense array 1021 operates as an all-points-addressable ("APA") mutual capacitive sense array. The sense array 1021 may be disposed to have a flat surface profile. Alternatively, the sense array 1021 may have non-flat surface profiles. Alternatively, other configurations of capacitive sense arrays may be used. For example, instead of vertical columns and horizontal rows, the sense array 1021 may have a hexagon arrangement, or the like. In one embodiment, the sense array 1021 may be included in an indium tin oxide (ITO) panel or a touch screen panel. In one embodiment, sense array 1021 is a capacitive sense array. In another embodiment, the sense array 1021 is non-transparent capacitive sense array (e.g., PC touchpad). In one embodiment, the sense array is configured so that processing device 1010 may generate touch data for a touch detected proximate to the capacitive sense array, the touch data represented as a plurality of cells.

In one embodiment, the capacitance-sensing circuit 1001 may include a CDC or other means to convert a capacitance into a measured value. The capacitance-sensing circuit 1001 may also include a counter or timer to measure the oscillator output. The processing device 1010 may further include software components to convert the count value (e.g., capacitance value) into a touch detection decision or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance-sensing circuit 1001 may be evaluating other measurements to determine the user interaction. For example, in the capacitance-sensing circuit 1001 having a sigma-delta modulator, the capacitance-sensing circuit 1001 is evaluating the ratio of pulse widths of the output (i.e., density domain), instead of the raw counts being over or under a certain threshold.

In another embodiment, the capacitance-sensing circuit 1001 includes a TX signal generator to generate a TX signal (e.g., stimulus signal) to be applied to the TX electrode and a receiver (also referred to as a sensing channel), such as an integrator, coupled to measure an RX signal on the RX electrode. In a further embodiment, the capacitance-sensing circuit 1001 includes an analog-to-digital converter (ADC) coupled to an output of the receiver to convert the measured RX signal to a digital value. The digital value can be further processed by the processing device 1010, the host 1050, or both.

The processing device 1010 is configured to detect one or more touches on a touch-sensing device, such as the sense array 1021. The processing device can detect conductive objects, such as touch objects 1040 (fingers or passive styluses, an active stylus, or any combination thereof). The capacitance-sensing circuit 1001 can measure a touch data on the sense array 1021. The touch data may be represented as multiple cells, each cell representing an intersection of sense elements (e.g., electrodes) of the sense array 1021. The capacitive sense elements are electrodes of conductive material, such as copper, silver, indium tin oxide (ITO), metal mesh, carbon nanotubes, or the like. The sense elements may also be part of an ITO panel. The capacitive sense elements can be used to allow the capacitance-sensing circuit 1001 to measure self-capacitance, mutual capacitance, or any combination thereof. In another embodiment, the touch data measured by the capacitance-sensing circuit 1001 can be processed by the processing device 1010 to generate a 2D capacitive image of the sense array 1021 (e.g., capacitive-sense array). In one embodiment, when the capacitance-sensing circuit 1001 measures mutual capacitance of the touch-sensing device (e.g., capacitive-sense array), the capacitance-sensing circuit 1001 determines a 2D capacitive image of the touch-sensing object on the touch surface and processes the data for peaks and positional information. In another embodiment, the processing device 1010 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

In one embodiment, the processing device 1010 further includes processing logic 1002. Some or all of the operations of the processing logic 1002 may be implemented in firmware, hardware, or software or some combination thereof. The processing logic 1002 may receive signals from the capacitance-sensing circuit 1001, and determine the state of the sense array 1021, such as whether an object (e.g., a finger) is detected on or in proximity to the sense array 1021 (e.g., determining the presence of the object), resolve where the object is on the sense array (e.g., determining the location of the object), tracking the motion of the object, or other information related to an object detected at the touch sensor. In another embodiment, processing logic 1002 may include capacitance-sensing circuit 1001.

The processing logic 1002 can be implemented in a capacitive touch screen controller. In one embodiment, the capacitive touch screen controller is the TrueTouch® capacitive controllers and CapSense® technology controllers (touch screens, buttons, sliders, proximity, etc.), such as the CY8C[2|3|4|5|6]xxxx family and CY8CMBRxx family of CapSense controllers, developed by Cypress Semiconductor Corporation of San Jose, Calif. The CapSense® technology can be delivered as a peripheral function in the Programmable System on a Chip (PSoC®) processing device, developed by Cypress Semiconductor Corporation, San Jose, Calif., such as the PSoC® 1, 3, 4, 5, 6 devices. The CapSense® controllers' sensing technology can resolve touch locations of multiple fingers and a stylus on the touch-screens, supports operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

In another embodiment, instead of performing the operations of the processing logic 1002 in the processing device 1010, the processing device 1010 may send the raw data or partially-processed data to the host 1050. The host 1050, as illustrated in FIG. 10, may include decision logic 1051 that performs some or all of the operations of the processing logic 1002. Water rejection tool 1020 may be implemented partially or fully by decision logic 1051. Water rejection tool 1020 may be a module within decision logic 1051. Alternatively, water rejection tool 1020 may be an algorithm in decision logic 1051. Host 1050 may obtain raw capacitance data from processing device 1010, and determine if a touch has occurred or not occurred on sense array 1021. Operations of the decision logic 1051 may be implemented in firmware, hardware, software, or a combination thereof. The host 1050 may include a high-level Application Programming Interface (API) in applications 1052 that perform routines on the received data, such as compensating for sensitivity differences, other compensation algorithms, baseline update routines, start-up and/or initialization routines, interpolation operations, or scaling operations. The operations described with respect to the processing logic 1002 may be implemented in the decision logic 1051, the applications 1052, or in other hardware, software, and/or firmware external to the processing device 1010. In some other embodiments, the processing device 1010 is the host 1050.

In another embodiment, the processing device 1010 may also include a non-sensing actions block 1003. Non-sensing actions block 1003 may be used to process and/or receive/transmit data to and from the host 1050. For example, additional components may be implemented to operate with the processing device 1010 along with the sense array 1021 (e.g., keyboard, keypad, mouse, trackball, LEDs, displays, or other peripheral devices).

As illustrated, capacitance-sensing circuit 1001 may be integrated into processing device 1010. Capacitance-sensing circuit 1001 may include an analog I/O for coupling to an external component, such as touch-sensor pad (not shown), sense array 1021, touch-sensor slider (not shown), touch-sensor buttons (not shown), and/or other devices. The capacitance-sensing circuit 1001 may be configurable to measure capacitance using mutual-capacitance sensing techniques, self-capacitance sensing technique, charge coupling techniques, combinations thereof, or the like. In one embodiment, capacitance-sensing circuit 1001 operates using a charge accumulation circuit, a capacitance modulation circuit, or other capacitance sensing methods known by those skilled in the art. In an embodiment, the capacitance-sensing circuit 1001 is of the Cypress controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 1001 in any chosen combination. In one embodiment, the TX and RX electrodes of the sense array 1021 are configurable to operate as TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of an RX electrode and a TX electrode (including one or more sense element) as done during mutual-capacitance sensing. An intersection between two sense elements may be understood as a location at which one sense electrode crosses over or overlaps another, while maintaining galvanic isolation from each other. The capacitance associated with the intersection between a TX electrode and an RX electrode can be sensed by selecting every available combination of TX electrode and RX electrode. When a touch object (i.e., conductive object), such as a finger or stylus, approaches the sense array 1021, the touch object causes a decrease in mutual capacitance between some of the TX/RX electrodes. In another embodiment, the presence of a finger increases the coupling capacitance of the electrodes. Thus, the location of the finger on the sense array 1021 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art. In addition, various types of coordinate interpolation algorithms may be used to detect the center of the touch as would be appreciated by one of ordinary skill in the art.

It should also be noted that the embodiments described herein are not limited to having a configuration of a processing device coupled to a host, but may include a system that measures the capacitance on the sensing device and sends the raw data to a host computer where it is analyzed by an application. In another embodiment, the processing that is done by processing device 1010 is done in the host.

The processing device 1010 may reside on a common carrier substrate such as, for example, an integrated circuit (IC) die substrate, or a multi-chip module substrate. Alternatively, the components of the processing device 1010 may be one or more separate integrated circuits and/or discrete components. In one embodiment, the processing device 1010 may be the Programmable System on a Chip (PSoC®) processing device, developed by Cypress Semiconductor Corporation, San Jose, Calif. One embodiment of the PSoC® processing device is illustrated and described below with respect to FIG. 11. Alternatively, the processing device 1010 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 1010 may be a network processor having multiple processors including a core unit and multiple micro-engines. Additionally, the processing device 1010 may include any combination of general-purpose processing device(s) and special-purpose processing device(s).

Capacitance-sensing circuit 1001 may be integrated into the IC of the processing device 1010, or alternatively, in a separate IC. Alternatively, descriptions of capacitance-sensing circuit 1001 may be generated and compiled for incorporation into other integrated circuits. For example, behavioral level code describing the capacitance-sensing circuit 1001, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 1001.

It should be noted that the components of electronic system 1000 may include all the components described above. Alternatively, electronic system 1000 may include some of the components described above.

In one embodiment, the electronic system 1000 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel, among others. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Electronic system 1000 includes capacitive button 1023. Capacitive button 1023 is connected to processing logic 1010. In one embodiment, capacitive button 1023 may be a single electrode. In another embodiment, capacitive button 1023 may be a pair of electrodes. In one embodiment, capacitive button 1023 is disposed on a substrate. In one embodiment, capacitive button 1023 may be part of sense array 1021. In another embodiment, capacitive button may be a separate from sense array 1021. In one embodiment, capacitive button 1023 may be used to in self-capacitance scan mode. In another embodiment, capacitive button 1023 may be used in mutual capacitance scan mode. In one embodiment, capacitive button 1023 may be used in both self-capacitance scan mode and mutual capacitance scan mode. Alternatively, the capacitive button 1023 is used in a multi-stage capacitance measurement process as described herein. Capacitive button 1023 may be one or more distinct buttons.

Figure 11:
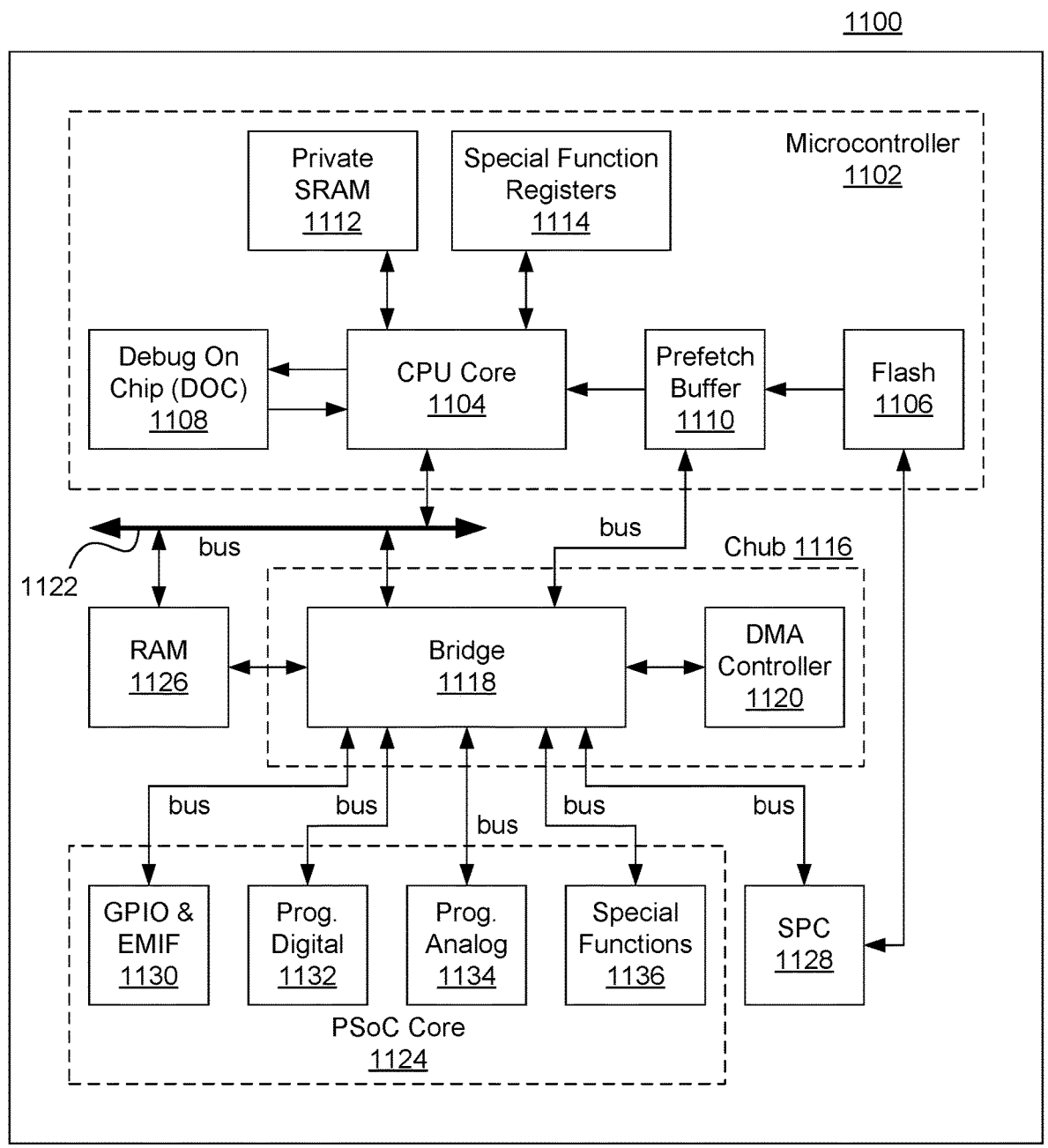
FIG. 11 illustrates an embodiment of a core architecture of the Programmable System-on-Chip (PSoC®) processing device.

FIG. 11 illustrates an embodiment of a core architecture 1100 of the PSoC® processing device, such as that used in the PSoC3® family of products offered by Cypress Semiconductor Corporation (San Jose, Calif.). In one embodiment, the core architecture 1100 includes a microcontroller 1102. The microcontroller 1102 includes a CPU (central processing unit) core 1104, flash program storage 1106, DOC (debug on chip) 1108, a prefetch buffer 1110, a private SRAM (static random access memory) 1112, and special functions registers 1114. In an embodiment, the DOC 1108, prefetch buffer 1110, private SRAM 1112, and special function registers 1114 are coupled to the CPU core 1104 (e.g., CPU core 1006), while the flash program storage 1106 is coupled to the prefetch buffer 1110.

The core architecture 1100 may also include a CHub (core hub) 1116, including a bridge 1118 and a DMA controller 1120 that is coupled to the microcontroller 1102 via bus 1122. The CHub 1116 may provide the primary data and control interface between the microcontroller 1102 and its peripherals (e.g., peripherals) and memory, and a programmable core 1124. The DMA controller 1120 may be programmed to transfer data between system elements without burdening the CPU core 1104. In various embodiments, each of these subcomponents of the microcontroller 1102 and CHub 1116 may be different with each choice or type of CPU core 1104. The CHub 1116 may also be coupled to shared SRAM 1126 and an SPC (system performance controller) 1128. The private SRAM 1112 is independent of the shared SRAM 1126 that is accessed by the microcontroller 1102 through the bridge 1118. The CPU core 1104 accesses the private SRAM 1112 without going through the bridge 1118, thus allowing local register and RAM accesses to occur simultaneously with DMA access to shared SRAM 1126. Although labeled here as SRAM, these memory modules may be any suitable type of a wide variety of (volatile or non-volatile) memory or data storage modules in various other embodiments.

In various embodiments, the programmable core 1124 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 1124 includes a GPIO (general purpose IO) and EMIF (extended memory interface) block 1130 to provide a mechanism to extend the external off-chip access of the microcontroller 1102, a programmable digital block 1132, a programmable analog block 1134, and a special functions block 1136, each configured to implement one or more of the subcomponent functions. In various embodiments, the special functions block 1136 may include dedicated (non-programmable) functional blocks and/or include one or more interfaces to dedicated functional blocks, such as USB, a crystal oscillator drive, JTAG, and the like.

The programmable digital block 1132 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 1132 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 1104) intervention and to help prevent the force clock stretching on any bit in the data stream; an I2C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a LINbus interface; a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 1134 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 1134 may support various analog functions including, but not limited to, analog routing, LCD drive IO support, capacitance-sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

The embodiments described above allow reducing water influence on the sensing device for low cost single layer or multi-layer designs, as well as a small form factor for the touch buttons. Some of these embodiments require additional shield layer, or external capacitors for carrying the shield signal. In other embodiments, described with respect to FIG. 8, there may be designs that do not require additional shield layers or external capacitors by using an electrical conduction layer on the touch side of the panel. In one embodiment, the electrical conduction layer has self-conductive material. The self-conductive material may have nearly 1-2 times the conductivity of liquid (e.g. water has around $$\frac{2 \cdot 10^{-5}}{\Omega \cdot m}$$

or 50K Ohms/sq) on the touch side of the panel. The electrical conduction layer may be a primary overlay or an additional overlay for waterproof realization. This structure can be used with self-capacitance sensing microcontrollers that do not allow shield electrode connections to the capacitance sensing pins, for example. Alternatively, the structure can be used with other capacitance-sensing devices and liquids as would be appreciated by one of ordinary skill in the art having the benefit of this disclosure.

The embodiments described herein may be used in various designs of mutual-capacitance sensing systems, in self-capacitance sensing systems, or combinations of both. In one embodiment, the capacitance sensing system detects multiple sense elements that are activated in the array and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "detecting," "comparing," "resetting," "adding," "calculating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the embodiments should, therefore, be determined with reference to the appended claims, along with the full scope of equivalents to which such claims are entitled.

What is claimed is:

1. A device comprising:
   a capacitance measurement circuit to couple to a touch button comprising an inner electrode substantially surrounded by an outer electrode; and
   a processing element to couple to the capacitance measurement circuit, wherein the processing element is to determine whether the touch button is pressed using a two-stage measurement process comprising:
      a first stage in which a first self-capacitance measurement of the inner electrode is made by the capacitance measurement circuit while an active shield signal is coupled to the outer electrode; and
      a second stage in which a second self-capacitance measurement of the outer electrode is made while a fixed voltage is coupled to the inner electrode.

2. The device of claim 1, wherein the capacitance measurement circuit comprises a ratiometric capacitance measurement circuit.

3. The device of claim 1, wherein the capacitance measurement circuit comprises a multi-configuration self-capacitance measurement circuit.

4. The device of claim 1, wherein the inner electrode comprises a first surface area and the outer electrode comprises a second surface area, wherein the first surface area and the second surface area are substantially similar.

5. The device of claim 1, wherein the capacitance measurement circuit comprises:
   a selection circuit; and
   a capacitance-to-digital conversion circuit coupled to the selection circuit, and wherein the processing element comprises water rejection logic to determine whether the touch button is pressed using the first self-capacitance measurement and the second self-capacitance measurement.

6. The device of claim 5, wherein the capacitance-to-digital conversion circuit comprises:
   a programmable current source selectively coupled to a first node;
   a driver comprising an input coupled to a voltage reference and an output selectively coupled to a second node;
   a comparator coupled to the first node and the voltage reference;
   a flip-flop coupled to an output of the comparator;
   a decimator coupled to an output of the flip-flop and selectively coupled to the first node; and a modulator capacitor coupled between the first node and ground.

7. The device of claim 1, further comprising:
a first multiplexer coupled to the inner electrode, the first multiplexer to selectively couple the inner electrode to the capacitance measurement circuit in the first stage and selectively couple the inner electrode to a fixed voltage node in the second stage; and
a second multiplexer coupled to the outer electrode, the second multiplexer to selectively couple the outer electrode to a voltage reference in the first stage and selectively couple the outer electrode to the capacitance measurement circuit in the second stage.

8. The device of claim 7, wherein the fixed voltage node is a ground terminal.

9. The device of claim 7, wherein the capacitance measurement circuit further comprises:
a first switch coupled between a first node and a third node of the capacitance measurement circuit, the first switch to connect the first node and the third node in a first phase of the capacitance measurement circuit;
a second switch coupled between the third node and ground, the second switch to ground the third node in a second phase of the capacitance measurement circuit;
a third switch coupled between the driver and a second node of the capacitance measurement circuit, the third switch to drive the voltage reference on the second node in the first phase; and
a fourth switch coupled between the second node and ground, the fourth switch to ground the second node in the second phase.

10. A method comprising:
coupling an inner electrode of a two-electrode touch button to a capacitance measurement circuit in a first stage of a two-stage measurement process;
coupling an outer electrode of the two-electrode button to an active shield signal in the first stage, the inner electrode being substantially surrounded by the outer electrode;
measuring, by the capacitance measurement circuit, a first self-capacitance measurement of the inner electrode while the active shield is coupled to the outer electrode in the first stage;
coupling the outer electrode to the capacitance measurement circuit in a second stage of the two-stage measurement process;
coupling the inner electrode to a fixed voltage in the second stage;
measuring, by the capacitance measurement circuit, a second self-capacitance measurement of the outer electrode while the fixed voltage is coupled to the inner electrode; and
determining whether the two-electrode touch button is pressed using the first self-capacitance measurement and the second self-capacitance measurement.

11. The method of claim 10, further comprising:
comparing the first self-capacitance measurement against a first enable threshold;
comparing the second self-capacitance measurement against a second enable threshold;
comparing a difference value between the first self-capacitance measurement and the second self-capacitance measurement against a third enable threshold;
detecting activation of the two-electrode touch button as being pressed when 1) the first self-capacitance measurement is greater than the first enable threshold, 2) the second self-capacitance measurement is greater than the second enable threshold, and 3) the difference value is greater than the third enable threshold; and
detecting deactivation of the two-electrode touch button as not being pressed when any one of 1), 2), or 3) is false.

12. The method of claim 11, further comprising:
resetting stored attributes of the two-electrode touch button when 1) a water flag is set;
resetting the stored attributes when 2) the first self-capacitance measurement is not greater than a touch noise threshold and 3) the second self-capacitance measurement is greater than the second enable threshold;
resetting the stored attributes when 4) the water flag is set and 5) the second self-capacitance measurement is less than half a water enable threshold;
setting the water flag when 6) the second self-capacitance measurement is greater than the water enable threshold and 7) the first self-capacitance measurement is greater than the second enable threshold; and
detecting deactivation of the two-electrode touch button as not being pressed when 7) is false.

13. The method of claim 10, further comprising:
comparing the first self-capacitance measurement against a first enable threshold;
comparing the second self-capacitance measurement against a second enable threshold;
comparing a ratio of the first self-capacitance measurement and the second self-capacitance measurement against a third enable threshold;
detects activation of the two-electrode touch button as being pressed when 1) the first self-capacitance measurement is greater than the first enable threshold, 2) the second self-capacitance measurement is greater than the second enable threshold, and 3) the ratio is greater than the third enable threshold; and
detects deactivation of the two-electrode touch button as not being pressed when any one of 1), 2), or 3) is false.

14. The method of claim 11, further comprising:
resetting stored attributes of the two-electrode touch button when 1) a water flag is set;
resetting the stored attributes when 2) the first self-capacitance measurement is not greater than a touch noise threshold and 3) the second self-capacitance measurement is greater than the second enable threshold;
resetting the stored attributes when 4) the water flag is set and 5) the second self-capacitance measurement is less than half a water enable threshold;
setting the water flag when 6) the second self-capacitance measurement is greater than the water enable threshold and 7) the first self-capacitance measurement is greater than the second enable threshold; and
detects deactivation of the two-electrode touch button as not being pressed when 7) is false.

15. The method of claim 10, further comprising:
comparing the first self-capacitance measurement against a first enable threshold;
comparing the second self-capacitance measurement against a second enable threshold;
comparing a difference value between the first self-capacitance measurement and the second self-capacitance measurement against a third enable threshold;
comparing a ratio of the first self-capacitance measurement and the second self-capacitance measurement against a fourth enable threshold;

detects activation of the two-electrode touch button as being pressed when 1) the first self-capacitance measurement is greater than the first enable threshold, 2) the second self-capacitance measurement is greater than the second enable threshold, 3) the difference value is greater than the third enable threshold, and 4) the ratio is greater than the third enable threshold; and detects deactivation of the two-electrode touch button as not being pressed when any one of 1), 2), 3), or 4) is false.

16. A system comprising:

a two-electrode touch button comprising an inner electrode substantially surrounded by an outer electrode; and a processing device coupled to the two-electrode touch button, wherein the processing device comprises:
  a capacitance measurement circuit selectively coupled to the inner electrode and the outer electrode of the two-electrode touch button; and
  a processing element coupled to the capacitance measurement circuit, wherein the processing element is to determine whether the two-electrode touch button is pressed using a two-stage measurement process comprising:
    a first stage in which a first self-capacitance measurement of the inner electrode is made by the capacitance measurement circuit while an active shield signal is coupled to the outer electrode; and
    a second stage in which a second self-capacitance measurement of the outer electrode is made while a fixed voltage is coupled to the inner electrode.

17. The system of claim 16, wherein the capacitance measurement circuit comprises at least one of a ratiometric capacitance measurement circuit or a multi-stage self-capacitance measurement circuit.

18. The system of claim 16, wherein the capacitance measurement circuit comprises:
  a selection circuit; and
  a capacitance-to-digital conversion circuit coupled to the selection circuit, and wherein the processing element comprises water rejection logic to determine whether the touch button is pressed using the first self-capacitance measurement and the second self-capacitance measurement.

19. The system of claim 18, wherein the capacitance-to-digital conversion circuit comprises:
  a programmable current source selectively coupled to a first node;
  a driver comprising an input coupled to a voltage reference and an output selectively coupled to a second node;
  a comparator coupled to the first node and the voltage reference;
  a flip-flop coupled to an output of the comparator;
  a decimator coupled to an output of the flip-flop and selectively coupled to the first node; and
  a modulator capacitor coupled between the first node and ground.

20. The system of claim 16, wherein the processing device further comprises:
  a first multiplexer coupled to the inner electrode, the first multiplexer to selectively couple the inner electrode to the capacitance measurement circuit in the first stage and selectively couple the inner electrode to a fixed voltage node in the second stage; and
  a second multiplexer coupled to the outer electrode, the second multiplexer to selectively couple the outer electrode to a voltage reference in the first stage and selectively couple the outer electrode to the capacitance measurement circuit in the second stage.

* * * * *